United States Patent
Cho et al.

(10) Patent No.: US 10,922,171 B2
(45) Date of Patent: Feb. 16, 2021

(54) ERROR CORRECTION CODE CIRCUITS, SEMICONDUCTOR MEMORY DEVICES AND MEMORY SYSTEMS

(71) Applicant: Samsung Electronics Co., Ltd., Suwon-si (KR)

(72) Inventors: Sung-Hye Cho, Hwaseong-si (KR); Ki-Jun Lee, Seoul (KR); Myung-Kyu Lee, Seoul (KR); Jun Jin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/441,287

(22) Filed: Jun. 14, 2019

(65) Prior Publication Data
US 2020/0192754 A1 Jun. 18, 2020

(30) Foreign Application Priority Data
Dec. 17, 2018 (KR) ........................ 10-2018-0162883

(51) Int. Cl.
*G06F 11/10* (2006.01)
*H03M 13/15* (2006.01)
*H03M 13/00* (2006.01)
*G11C 29/52* (2006.01)

(52) U.S. Cl.
CPC .......... *G06F 11/1068* (2013.01); *G11C 29/52* (2013.01); *H03M 13/1575* (2013.01); *H03M 13/616* (2013.01)

(58) Field of Classification Search
CPC ................ G06F 11/1068; G11C 29/52; H03M 13/1575; H03M 13/616
See application file for complete search history.

(56) References Cited

U.S. PATENT DOCUMENTS

| | | | | |
|---|---|---|---|---|
| 3,656,107 A | * | 4/1972 | Hsiao | H03M 13/13 714/753 |
| 4,077,565 A | * | 3/1978 | Nibby, Jr. | G06F 11/1048 714/758 |
| 4,464,753 A | * | 8/1984 | Chen | G06F 11/1028 714/765 |
| 6,463,563 B1 | * | 10/2002 | Chen | G11C 29/02 714/768 |
| 6,822,913 B2 | | 11/2004 | Pochmuller | |
| 6,978,415 B1 | * | 12/2005 | Weng | H03M 13/15 708/492 |
| 7,340,668 B2 | | 3/2008 | Klein | |
| 7,428,689 B2 | | 9/2008 | Wallner et al. | |
| 7,761,772 B2 | | 7/2010 | Dimou | |
| 7,984,357 B2 | | 7/2011 | Kirscht et al. | |

(Continued)

*Primary Examiner* — Guy J Lamarre
(74) *Attorney, Agent, or Firm* — Harness, Dickey & Pierce, P.L.C.

(57) ABSTRACT

An error correction code (ECC) circuit of a semiconductor memory device includes a syndrome generation circuit and a correction circuit. The syndrome generation circuit generates syndrome based on a message and first parity bits in a codeword read from a memory cell array by using one of a first parity check matrix and a second parity check matrix, in response to a decoding mode signal. The correction circuit receives the codeword, corrects at least a portion of (t1+t2) error bits in the codeword based on the syndrome and outputs a corrected message. Here, t1 and t2 are natural numbers, respectively.

20 Claims, 24 Drawing Sheets

(56) References Cited

U.S. PATENT DOCUMENTS

| | | | |
|---|---|---|---|
| 9,772,900 B2 | 9/2017 | Hu et al. | |
| 9,823,964 B2 | 11/2017 | Reed et al. | |
| 2007/0011598 A1* | 1/2007 | Hassner | H03M 13/19 |
| | | | 714/801 |
| 2007/0150798 A1* | 6/2007 | Shieh | H03M 13/6502 |
| | | | 714/785 |
| 2010/0125776 A1* | 5/2010 | Mutchnik | H03M 13/152 |
| | | | 714/785 |
| 2015/0153965 A1 | 6/2015 | Park | |
| 2016/0062825 A1* | 3/2016 | Shiratake | H03M 13/05 |
| | | | 714/773 |
| 2017/0077963 A1* | 3/2017 | Jung | H03M 13/6502 |
| 2017/0111061 A1* | 4/2017 | Ish-Shalom | H03M 13/098 |
| 2020/0097360 A1* | 3/2020 | Lu | H03M 13/1575 |
| 2020/0142771 A1* | 5/2020 | Cho | G11C 29/52 |

* cited by examiner

FIG. 4

| DATA BITS | PARITY BITS | | | PARITY O/H | | |
|---|---|---|---|---|---|---|
| | SEC | SEC-DED | DEC | SEC | SEC-DED | DEC |
| 8 | 4 | 5 | 8 | 50.0% | 62.5% | 100% |
| 64 | 7 | 8 | 14 | 10.9% | 12.5% | 21.9% |
| 128 | 8 | 9 | 16 | 6.3% | 7.0% | 12.5% |
| 256 | 9 | 10 | 18 | 3.5% | 3.9% | 7.0% |
| 512 | 10 | 11 | 20 | 2.0% | 2.1% | 3.9% |

| | | | | |
|---|---|---|---|---|
| 0 | 1 | 1 | 0 | 1 |
| 1 | 0 | 0 | 1 | 1 |
| 1 | 0 | 1 | 0 | 1 |
| 0 | 1 | 1 | 0 | 0 |
| 1 | 1 | 0 | 1 | 1 |
| 0 | 0 | 1 | 1 | 1 |
| 1 | 0 | 0 | 0 | 1 |
| 0 | 0 | 1 | 0 | 1 |
| 0 | 0 | 0 | 0 | 1 |
| 0 | 1 | 0 | 0 | 0 |
| 1 | 0 | 0 | 1 | 0 |
| 1 | 1 | 1 | 0 | 1 |
| 1 | 1 | 1 | 1 | 0 |
| 0 | 0 | 1 | 1 | 0 |
| 1 | 1 | 0 | 1 | 1 |
| 1 | 0 | 1 | 1 | 1 |
| 1 | 1 | 1 | 0 | 0 |
| 1 | 0 | 1 | 0 | 0 |
| 1 | 0 | 1 | 0 | 0 |
| 0 | 0 | 1 | 0 | 0 |
| 0 | 1 | 0 | 0 | 1 |
| 1 | 1 | 0 | 1 | 0 |
| 0 | 1 | 1 | 1 | 1 |
| 0 | 0 | 0 | 1 | 0 |
| 1 | 1 | 0 | 0 | 0 |
| 1 | 1 | 1 | 1 | 1 |
| 0 | 1 | 1 | 1 | 0 |
| 0 | 1 | 0 | 1 | 1 |
| 0 | 1 | 0 | 1 | 0 |
| 0 | 0 | 0 | 1 | 0 |
| 1 | 0 | 0 | 0 | 0 |

FIG. 18

| t1\t2 | 1 | 2 | 3 | 4 | 5 | 6 |
|---|---|---|---|---|---|---|
| 1 | 5,7,9,11,13,15 | 5,7,9,11,13,15 | 5,7,11,13 | 5,7,11,13 | 5,7,13 | 5,7,13 |
| 2 | 5,6,7,9,10,11,13,14,15 | 5,7,10,11,13,14 | 5,7,11,13 | 7,11,13 | 7,11,13 | 7,11,13 |
| 3 | 5,7,10,11,13,14,,16 | 5,7,11,13 | 7,11,13 | 7,11,13 | 7,11,13 | 7,11,13 |
| 4 | 5,7,9,11,13,15 | 7,9,11,13,15 | 7,9,11,13,15 | 7,9,11,13,15 | 7,9,11,13,15 | 7,9,11,13,15 |
| 5 | 6,7,8,9,11,12,13,14,15,16 | 6,7,8,9,11,13,14,15,16 | 7,9,11,13,15 | 7,9,11,13,15 | 7,9,11,13,15 | 7,11,13 |
| 6 | 6,7,8,9,10,11,13,14,15,16 | 7,9,11,13,15 | 7,9,11,13,15 | 7,9,11,13,15 | 7,11,13 | 7,13 |

ERROR CORRECTION CODE CIRCUITS, SEMICONDUCTOR MEMORY DEVICES AND MEMORY SYSTEMS

CROSS-REFERENCE TO RELATED APPLICATION(S)

This application claims priority under 35 U.S.C. § 119 to Korean Patent Application No. 10-2018-0162883, filed on Dec. 17, 2018 in the Korean Intellectual Property Office, the disclosure of which is incorporated by reference herein in its entirety.

BACKGROUND

1. Technical Field

Example embodiments relate to memory devices, and more particularly to error correction code (ECC) circuits of semiconductor memory devices, semiconductor memory devices and/or memory systems.

2. Discussion of the Related Art

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrinkage in fabrication design rule of DRAMs, bit errors of memory cells in the DRAMs may rapidly increase and yield of the DRAMs may decrease.

SUMMARY

Some example embodiments provide an error correction code (ECC) circuit of a semiconductor memory device, capable of enhancing error correction capability and capable of using on-chip ECC efficiently.

Some example embodiments provide a semiconductor memory device capable of enhancing error correction capability and capable of using on-chip ECC efficiently.

Some example embodiments provide a memory system capable of enhancing error correction capability and capable of using on-chip ECC efficiently.

According to some example embodiments, an ECC circuit of a semiconductor memory device includes a syndrome generation circuit configured to generate a syndrome based on a message and first parity bits in a codeword read from a memory cell array by using one of a first parity check matrix and a second parity check matrix, in response to a decoding mode signal, and a correction circuit configured to receive the codeword, correct at least a portion of (t1+t2) error bits in the codeword, based on the syndrome, wherein t1 and t2 are natural numbers, and output a corrected message.

According to some example embodiments, a semiconductor memory device includes a memory cell array including a plurality of memory cells coupled to a plurality of word-lines and a plurality of bit-lines, an error correction code (ECC) circuit configured to generate a codeword by performing ECC encoding on a message received from a memory controller based on a generation matrix, generate a syndrome based on the message and first parity bits in a read codeword from the memory cell array, correct at least a portion of (t1+t2) error bits in the read codeword based on the syndrome, wherein t1 and t2 are natural numbers, and output a corrected message, and a control logic circuit configured to control the ECC circuit based on a command and an address received from the memory controller.

According to some example embodiments, a memory system includes a semiconductor memory device, and a memory controller configured to control the semiconductor memory device, wherein the semiconductor memory device includes, a memory cell array including a plurality of memory cells coupled to a plurality of word-lines and a plurality of bit-lines, an error correction code (ECC) circuit configured to, generate a codeword by performing ECC encoding on a message received from the memory controller based on a generation matrix, generate a syndrome based on the message and first parity bits in a read codeword from the memory cell array, correct at least a portion of (t1+t2) error bits in the read codeword based on the syndrome, wherein t1 and t2 are natural numbers, and output a corrected message, and a control logic circuit configured to control the ECC circuit based on a command and an address received from the memory controller.

Accordingly, the semiconductor memory device obtains code information of a system ECC engine having t1-bit error correction capability, the semiconductor memory device having t2-bit error correction capability may correct (t1+t2) error bits by selectively using a parity check matrix associated with the code information of the system ECC engine when the semiconductor memory device performs ECC decoding. Therefore, the semiconductor memory device may enhance error correction capability of on-chip ECC engine and may use on-chip ECC engine efficiently.

BRIEF DESCRIPTION OF THE DRAWINGS

Illustrative, non-limiting example embodiments will be more clearly understood from the following detailed description taken in conjunction with the accompanying drawings.

FIG. 4 is a diagram for describing on-chip ECC levels according to data bits and parity bits.

FIG. 9 illustrates an example of the first generation matrix stored in the memory in the system ECC engine of FIG. 3.

FIG. 10 illustrates an example of the system parity check matrix stored in the memory in the system ECC engine of FIG. 3.

FIG. 11 illustrates an example of the second generation matrix stored in the memory in the ECC engine of FIG. 8.

FIG. 12 illustrates an example of the first parity check matrix stored in the memory in the ECC engine of FIG. 8.

FIG. 13 illustrates an example of the second parity check matrix stored in the memory in the ECC engine of FIG. 8.

FIG. 18 is a table for explaining values in which both of the first decoding mode and the second decoding mode are possible according to correctable error bits in the first decoding mode and the second decoding mode.

DETAILED DESCRIPTION

Various example embodiments will be described more fully hereinafter with reference to the accompanying drawings, in which some example embodiments are shown.

Figure 1:
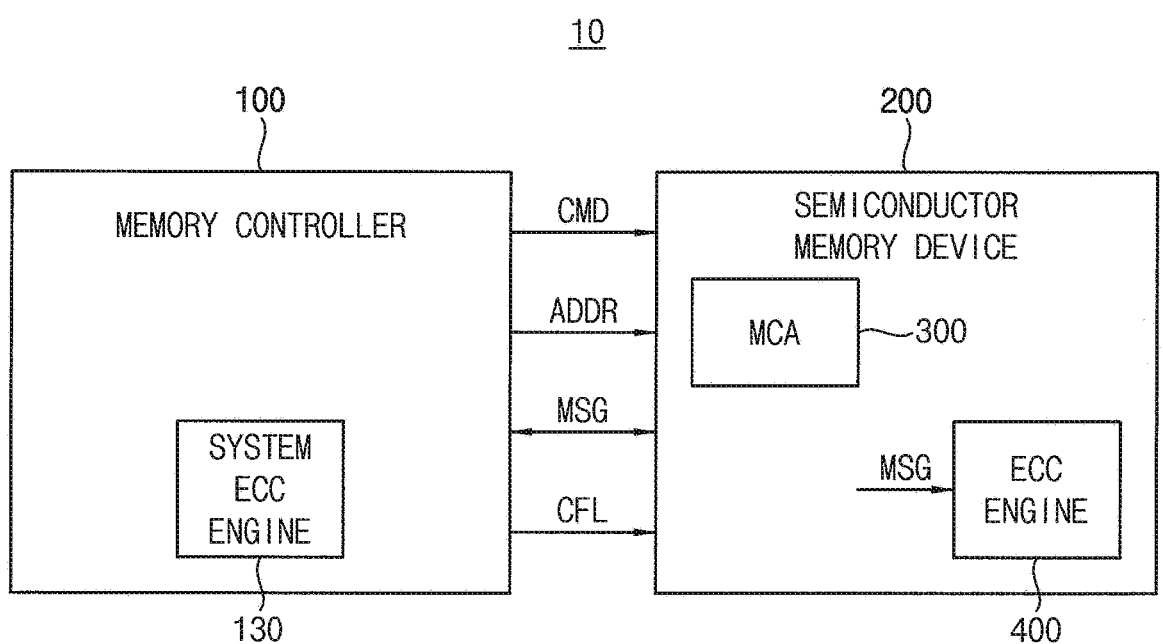
FIG. 1 is a block diagram illustrating a memory system according to some example embodiments.

FIG. 1 is a block diagram illustrating a memory system according to some example embodiments.

Referring to FIG. 1, a memory system 10 may include a memory controller 100 and a semiconductor memory device 200.

The memory controller 100 may control an overall operation of the memory system 10. The memory controller 100 may control an overall data exchange between a host and the semiconductor memory device 200. For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200.

The memory controller 100 transmits a command CMD and an address ADDR to the semiconductor memory device 200 and exchanges a message MSG with the semiconductor memory device 200. The memory controller 100 transmits a configuration flag signal CFL to the semiconductor memory device 200.

In some example embodiments, the semiconductor memory device 200 includes dynamic memory cells such as a dynamic random access memory (DRAM).

The memory controller 100 may include a system error correction code (ECC) engine 130 and the semiconductor memory device 200 includes an ECC engine 400 and a memory cell array 300.

The system ECC engine 130 performs a first ECC encoding on a data received from the host to generate the message MSG and transmit the message MSG to the semiconductor memory device 200, as a coded message CM including the link parity and the message MSG. In addition, the system ECC engine 130 performs an ECC decoding on the message MSG provided from the semiconductor memory device 200 to recover data and provides the data to the host. The system ECC engine 130 may use a first generation matrix. In some example embodiments, the first generation matrix may represent a single error correction (SEC) code.

The ECC engine 400 performs an ECC encoding on the message MSG based on a second generation matrix to generate first parity bits and stores a codeword including the message MSG and the first parity bits in a target page in the memory cell array 300. The ECC engine 400 may be referred to as an ECC circuit or an error correction circuit.

The ECC engine 400 corrects at least a portion of (t1+t2) error bits in a read codeword read from the target page by using the message and the first parity bits in the read codeword and transmits a corrected message to the memory controller 100. Here, t1 and t2 are natural numbers, respectively. Here, t1 represents a number of error bits which the system ECC engine 130 is capable of correcting and t2 represents a number of error bits which the ECC engine 400 is capable of correcting.

The memory controller 100 may transmit the configuration flag signal CFL indicating information on the first generation matrix to the semiconductor memory device 200 during a power-up sequence of the semiconductor memory device 200. The semiconductor memory device 200 receives the configuration flag signal CFL and may obtain information on the first generation matrix which is associated with generation of the first parity bits included in the message MSG provided from the memory controller 100.

Figure 2:
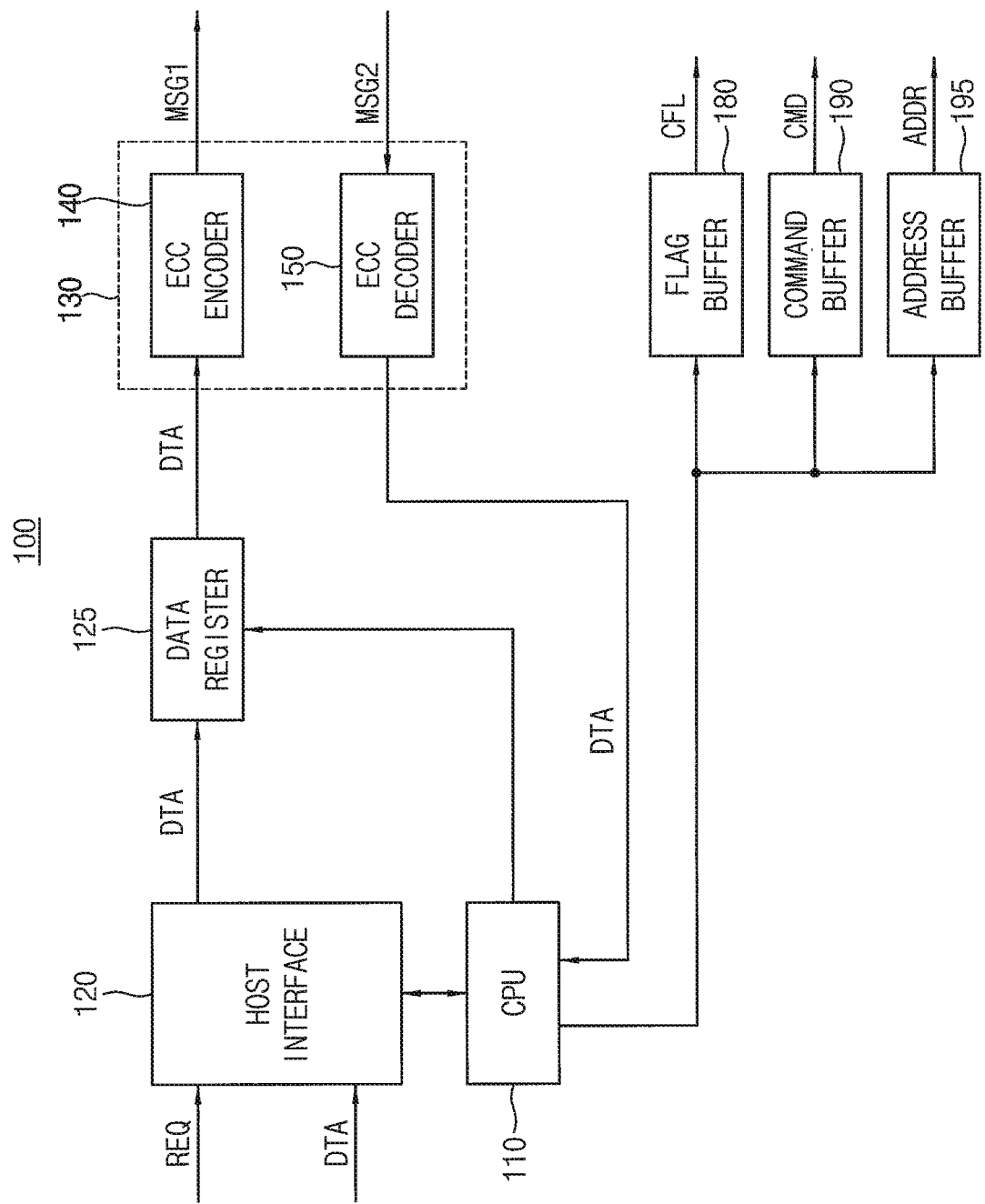
FIG. 2 is block diagram illustrating the memory controller in the memory system of FIG. 1 according to some example embodiments.

FIG. 2 is block diagram illustrating the memory controller in the memory system of FIG. 1 according to some example embodiments.

Referring to FIG. 2, the memory controller 100 includes a central processing unit (CPU) 110, a host interface 120, a data register 125, the system ECC engine 130, a flag buffer 180, a command buffer 190 and/or an address buffer 195. The system ECC engine 130 includes an ECC encoder 140 and/or an ECC decoder 150.

The host interface 120 receives a request REQ and data DTA from the host and provides the data DTA to the data register 125. The data register 125 continuously (or sequentially) outputs the data DTA to the system ECC engine 130.

The ECC encoder 140 performs a first ECC encoding on the data DTA by using the first generation matrix to generate a message MSG1 and output the message.

The ECC decoder 150 performs an ECC decoding on a message MSG2 to recover the data DTA and provides the data DTA to the CPU 110.

The CPU 110 receives the data DTA and controls the flag buffer 180 to transmit the configuration flag signal CFL to the semiconductor memory device 200.

The command buffer 190 stores the command CMD corresponding to the request REQ and transmits the command CMD to the semiconductor memory device 200 under control of the CPU 110. The address buffer 195 stores the address ADDR and transmits the address ADDR to the semiconductor memory device 200 under control of the CPU 110.

Figure 3:
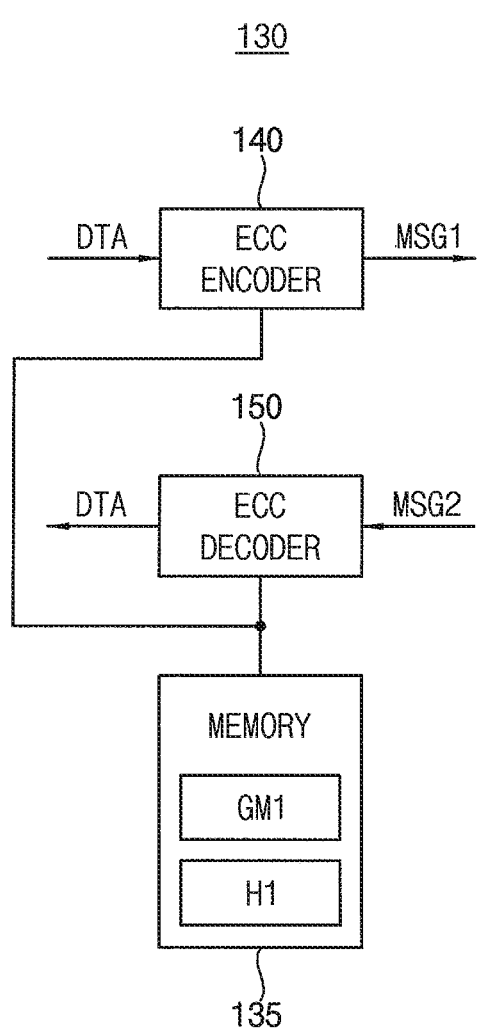
FIG. 3 is a block diagram illustrating an example of the system ECC engine in FIG. 2 according to some example embodiments.

FIG. 3 is a block diagram illustrating an example of the system ECC engine in FIG. 2 according to some example embodiments.

Referring to FIG. 3, the system ECC engine 130 includes a memory 135, the ECC encoder 140 and/or the ECC decoder 150.

The memory 135 may store a first generation matrix GM1 that implements a first ECC and a system parity check matrix. The system parity check matrix H1 may be an SEC code or a single error correction-double error detection (SEC-DED) code. Therefore, the ECC decoder 150 may correct one error bit in the message MSG2 or may detect two error bits in the message MSG2.

FIG. 4 is a diagram for describing on-chip ECC levels according to data bits and parity bits.

In FIG. 4, SEC represents single error correction, DED represents double error detection and DEC represents double error correction. FIG. 4 illustrates parity bits and corresponding size overheads of the parity bits (PARITY O/H). The parity bits correspond to a Hamming code or an extended Hamming code. The size overhead of the parity bits correspond to a ratio of the parity bits of the parity data corresponding to the write data to the data bits of the write data.

As illustrated in FIG. 4, as the parity bit number is increased with respect to the same data bit number, that is, as the ratio of the parity bit number to the data bit number is increased, capability of error detection and correction is increased. As the data bit number is increased with respect to the same capability of error detection and correction, the corresponding parity bit number is increased but the ratio of the parity bit number to the data bit number is decreased.

As such, the error detection capability and/or the error correction capability may be increased as the ratio of the parity bit number to the corresponding data bit number is increased. As a result, the on-chip ECC level may be raised as the ratio of the parity bit number to the corresponding data bit number is increased.

Memory resources may be wasted and a size of the semiconductor memory device may be increased if the on-chip ECC level is set higher than necessary. In contrast, the error detection and correction capability may be degraded and performance of the semiconductor memory device may be degraded if the on-chip ECC level is set lower than necessary.

Figure 5:
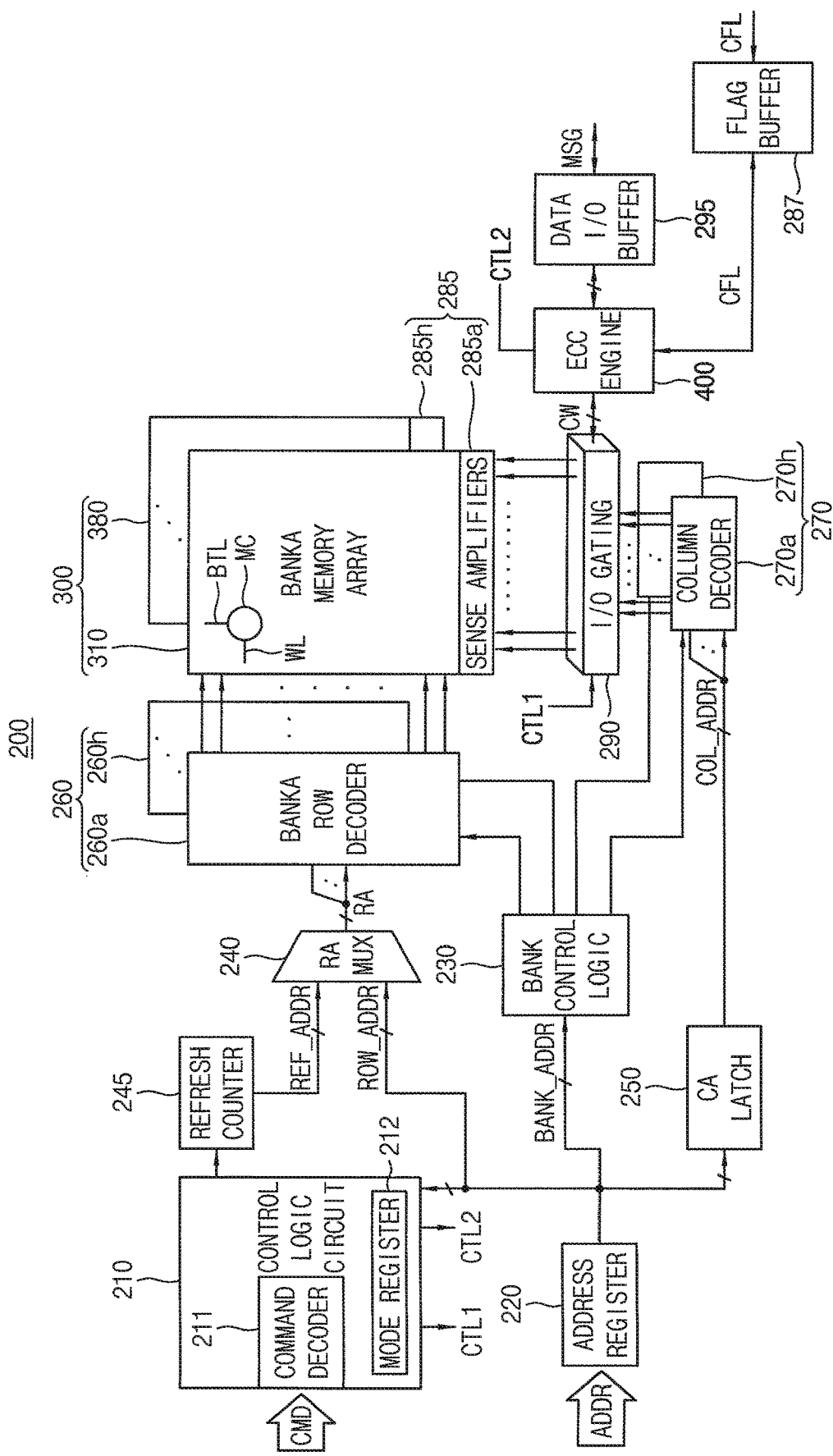
FIG. 5 is a block diagram illustrating the semiconductor memory device in the memory system of FIG. 1 according to some example embodiments.

FIG. 5 is a block diagram illustrating the semiconductor memory device in the memory system of FIG. 1 according to some example embodiments.

Referring to FIG. 5, the semiconductor memory device 200 includes a control logic circuit 210, an address register 220, a bank control logic 230, a row address multiplexer 240, a column address latch 250, a row decoder 260, a column decoder 270, the memory cell array 300, a sense amplifier unit 285, an input/output (I/O) gating circuit 290, a data input/output (I/O) buffer 295, a refresh counter 245, the ECC engine 400, and/or a flag buffer 287.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC coupled to word-lines WL and bit-lines BTL.

The address register 220 receives an address ADDR including a bank address BANK_ADDR, a row address ROW_ADDR and a column address COL_ADDR and the command CMD from the memory controller 100.

The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 in order to output data corresponding to the column address COL_ADDR.

The I/O gating circuit 290 includes a circuitry for gating input/output data. The I/O gating circuit 290 further includes read data latches for storing data that is output from the first through eighth bank arrays 310~380, and write drivers for writing data to the first through eighth bank arrays 310~380.

Codeword CW to be read from one bank array of the first through eighth bank arrays 310~380 may be sensed by a sense amplifier coupled to the one bank array from which the data is to be read, and may be stored in the read data latches.

The codeword CW stored in the read data latches is ECC-decoded by the ECC engine 400 and may be provided to the memory controller 100 via the data I/O buffer 295.

Message MSG to be written in one bank array of the first through eighth bank arrays 310~380 may be provided to the data I/O buffer 295 from the memory controller 100. The message MSG is provided to the ECC engine 400. The ECC engine 400 performs an ECC encoding on the message MSG to generate first parity bits and provides the I/O gating circuit 290 with codeword CW including the message MSG and the first parity bits. The I/O gating circuit 290 may write the codeword CW in a target page in the one bank array through the write drivers.

The ECC engine 400 may generate syndrome based on the message MSG and the first parity bits in the codeword read from the target page, may correct at least a portion of (t1+t2) error bits in the codeword and may provide a corrected message to the data I/O buffer 295. The ECC engine 400 may correct (t1+t2) error bits by performing a first ECC decoding in a first decoding mode and may correct t2 error bit by performing a second ECC decoding in a second decoding mode. For example, when each of t1 and t2 is one, the ECC engine 400 may correct two error bits in the first decoding mode and may correct one error bit in the second decoding mode.

The flag buffer 287 receives the configuration flag signal CFL and provides the configuration flag signal CFL to the ECC engine 400.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290 and a second control signal CTL2 to control the ECC engine 400.

Figure 6:
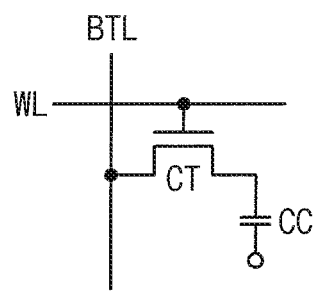
FIG. 6 is a circuit diagram of an example implementation of the memory cell shown in FIG. 5.

FIG. 6 is a circuit diagram of an example implementation of the memory cell shown in FIG. 5.

Referring to FIG. 6, a memory cell MC includes a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

FIG. 6 illustrates the memory cell MC is implemented with a dynamic memory cell. However, the memory cell MC may be implemented with a resistive memory cell.

Figure 7:
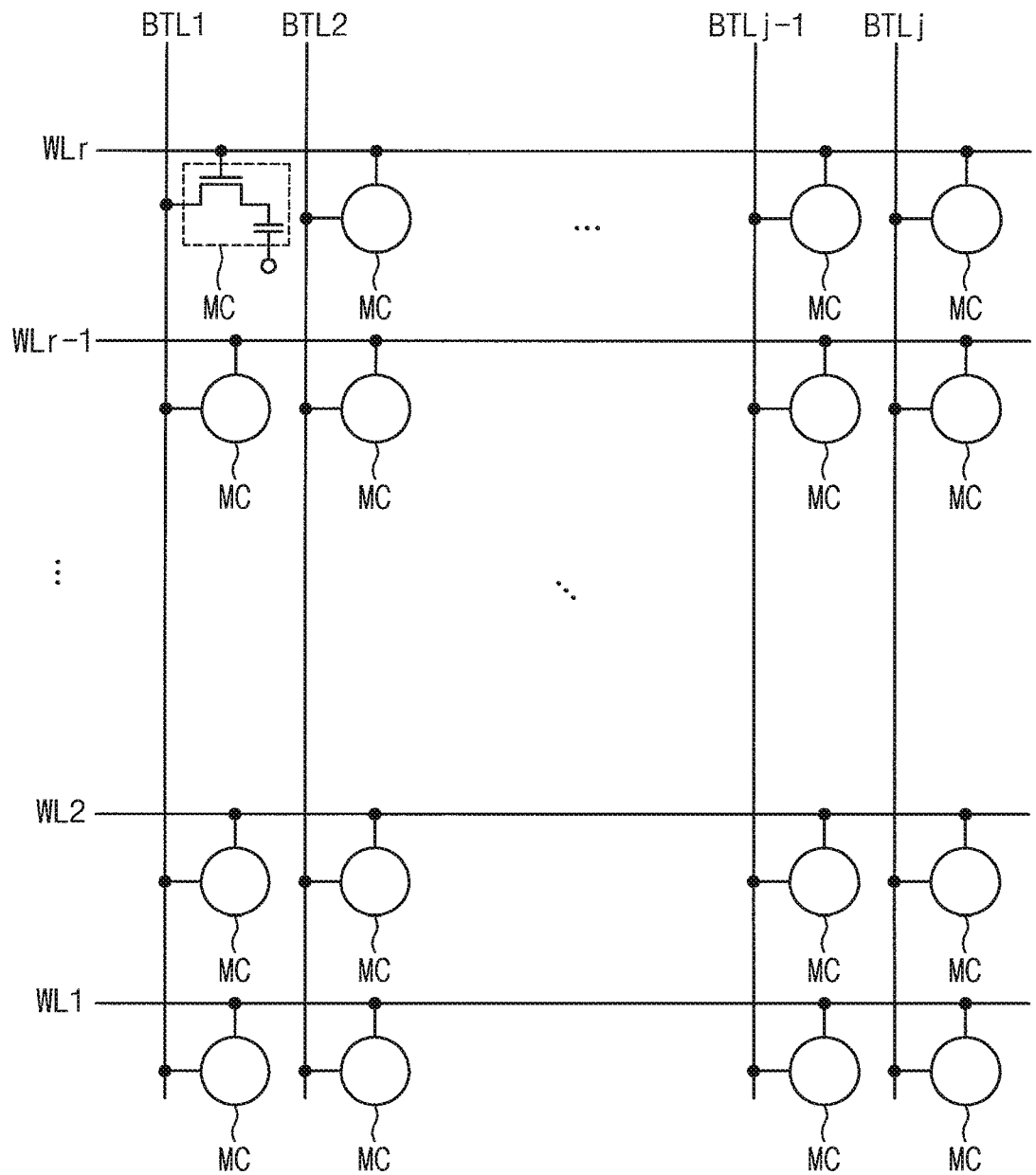
FIG. 7 illustrates an example of the first bank array in the semiconductor memory device of FIG. 5.

FIG. 7 illustrates an example of the first bank array in the semiconductor memory device of FIG. 5.

Referring to FIG. 7, the first bank array 310 includes a plurality of word-lines WL1~WLr (r is a natural number greater than two), a plurality of bit-lines BTL1~BTLj (j is a natural number greater than two), and/or a plurality of memory cells MCs disposed near intersections between the word-lines WL1~WLr and the bit-lines BTL1~BTLj. In some example embodiments, each of the plurality of memory cells MCs may include a dynamic random access memory (DRAM) cell structure. The plurality of word-lines WL1~WLr to which the plurality of memory cells MCs are connected may be defined as rows of the first bank array 310 and the plurality of bit-lines BTL1~BTLj to which the plurality of memory cells MCs are connected may be defined as columns of the first bank array 310.

Figure 8:
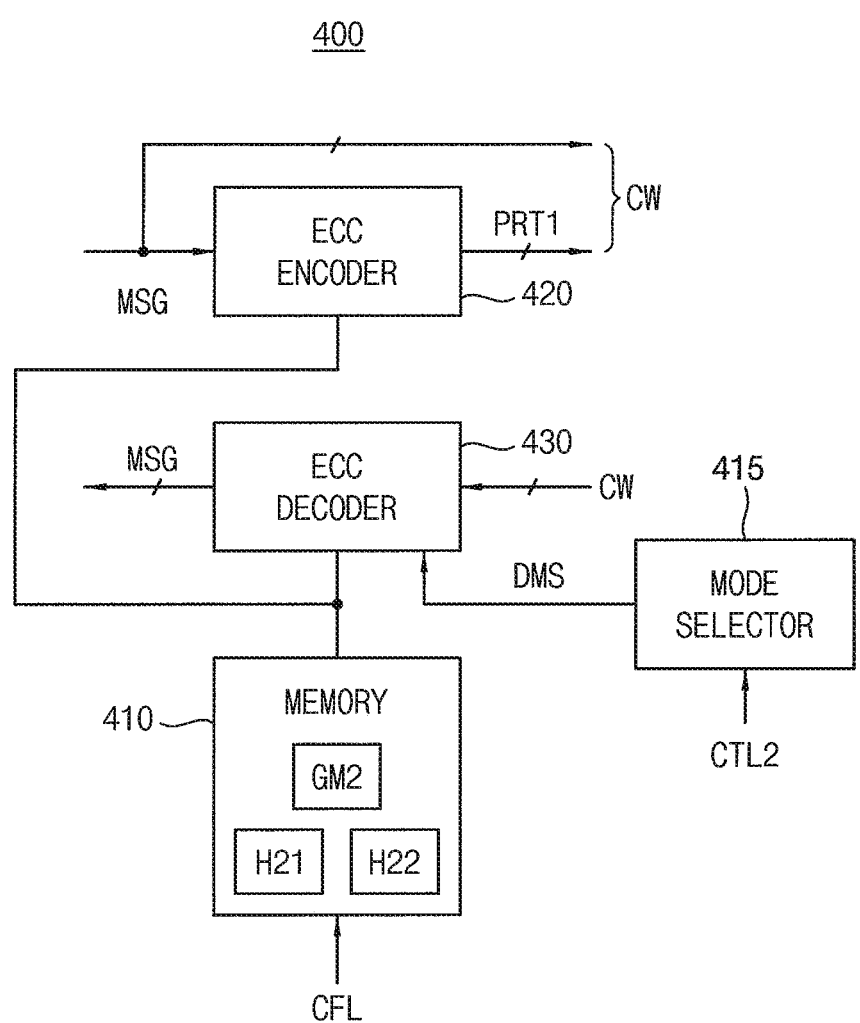
FIG. 8 is a block diagram illustrating an example of the ECC engine in the semiconductor memory device of FIG. 5 according to some example embodiments.

FIG. 8 is a block diagram illustrating an example of the ECC engine in the semiconductor memory device of FIG. 5 according to some example embodiments.

Referring to FIG. 8, the ECC engine 400 includes a memory 410, an ECC encoder 420, an ECC decoder 430 and/or a mode selector 415.

The memory 410 stores a second generation matrix GM2, a first parity check matrix H21 and/or a second parity check matrix H22. The ECC encoder 420 is connected to the memory 410 and performs an ECC encoding by using the second generation matrix GM2 and the ECC decoder 430 is connected to the memory 410 and the ECC decoder 430 performs an ECC decoding by using one of the first parity check matrix H21 and the second parity check matrix H22.

The ECC encoder 420 performs an ECC encoding on the message MSG to generate first parity bits PRT1 by using the second generation matrix GM2 in a write operation of the semiconductor memory device 200. The ECC encoder 420 provides the I/O gating circuit 290 with the codeword CW including the message MSG and the first parity bits PRT1.

The mode selector 415 may provide the ECC decoder 430 with a decoding mode signal DMS designating one of a first decoding mode and a second decoding mode in response to the second control signal CTL2. The control logic circuit 210 may provide the mode selector 415 with the second control signal CTL2 designating one of the first decoding mode and the second decoding mode, based on power consumption of the semiconductor memory device 200 and data credibility.

The memory 410 receives the configuration flag signal CFL and stores information associated with the first generation matrix GM1 and the system parity check matrix H1 which the system ECC engine 130 uses The ECC decoder 430 receives the codeword CW in a read operation of the semiconductor memory device 200, performs one of a first ECC decoding and a second ECC decoding based on message bits of the message MSG and the first parity bits PRT1 in the codeword CW and corrects at least a portion of (t1+t2) error bits in the codeword CW, in response to a decoding mode signal DMS.

If the decoding mode signal DMS designates the first decoding mode, the ECC decoder 430 may correct (t1+t2) error bits in the codeword CW by using the first parity check matrix H21. If the decoding mode signal DMS designates the second decoding mode, the ECC decoder 430 may correct t2 error bit in the codeword CW by using the second parity check matrix H22.

As will be described below, the first parity check matrix H21 may include the system parity check matrix H1 which the system ECC engine 130 uses, as a part of the first parity check matrix H21, the ECC decoder 430 may correct (t1+t2) error bits in the codeword CW in the first decoding mode.

In some example embodiments, the mode selector 415 may be disposed outside of the ECC engine 400.

Figure 9:
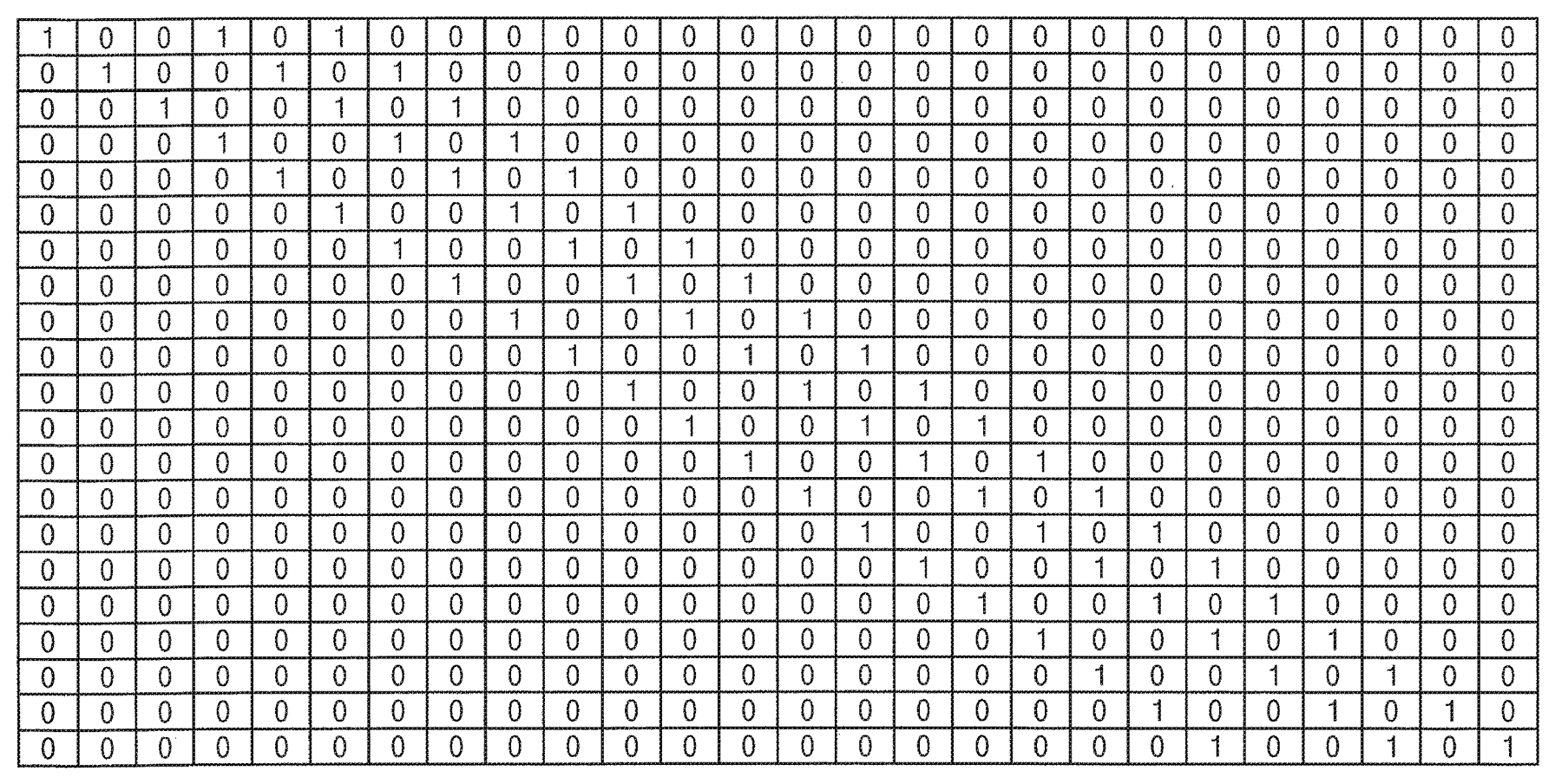

FIG. 9 illustrates an example of the first generation matrix stored in the memory in the system ECC engine of FIG. 3.

Referring to FIGS. 3 and 9, the first generation matrix GM1 may include a matrix having 21*26 elements. That is, the first generation matrix GM1 includes 21 row vectors and 26 column vectors. The first generation matrix GM1 may be generated based on a first generation polynomial g1(x). g1(x) may be represented by $x^5+x^2+x^1$. Therefore, each of the row vectors in the first generation matrix GM1 may include three '1's.

If the data DTA in FIG. 3 is represented as m=[$m_0$ $m_1$ ... $m_{20}$], the message MSG is represented as mGM1=x and x is represented as x=[$x_0$ $x_1$ ... $x_{25}$].

Figure 10:
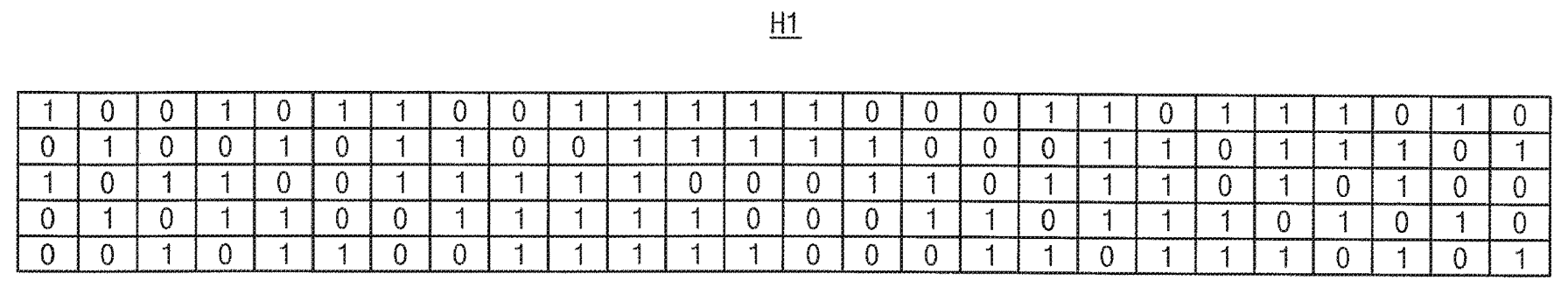

FIG. 10 illustrates an example of the system parity check matrix stored in the memory in the system ECC engine of FIG. 3.

Referring to FIGS. 3 and 10, the system parity check matrix H1 may include a matrix having 5*26 elements. That is, the system parity check matrix H1 includes 5 row vectors and 26 column vectors.

The system parity check matrix H1 may correct t1 error bit.

Figure 11:
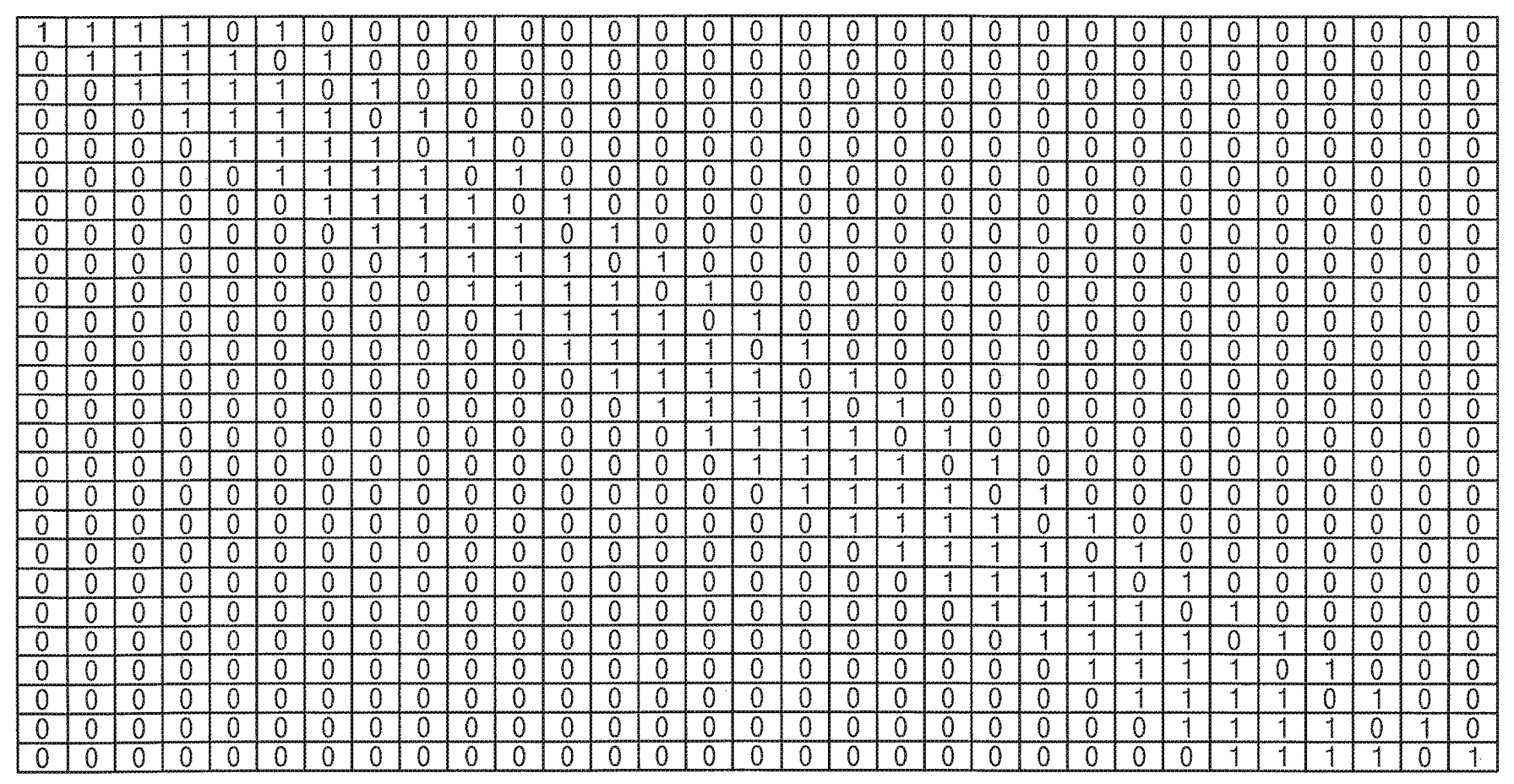

FIG. 11 illustrates an example of the second generation matrix stored in the memory in the ECC engine of FIG. 8.

Referring to FIGS. 8 and 11, the second generation matrix GM2 may include a matrix having 26*31 elements. That is, the second generation matrix GM2 includes 26 row vectors and 31 column vectors.

The second generation matrix GM2 may be generated based on a second generation polynomial g2(x). g2(x) may be represented by $x^5+x^4+x3+x^2+x^1$. Therefore, each of the row vectors in the second generation matrix GM1 may include five '1's.

If the message MSG in FIG. 8 is represented as x=[$x_0$ $x_1$ ... $x_{25}$], the codeword CW is represented as xGM2=c and c is represented as c=[$c_0$c1 ... $c_{30}$].

Figure 12:
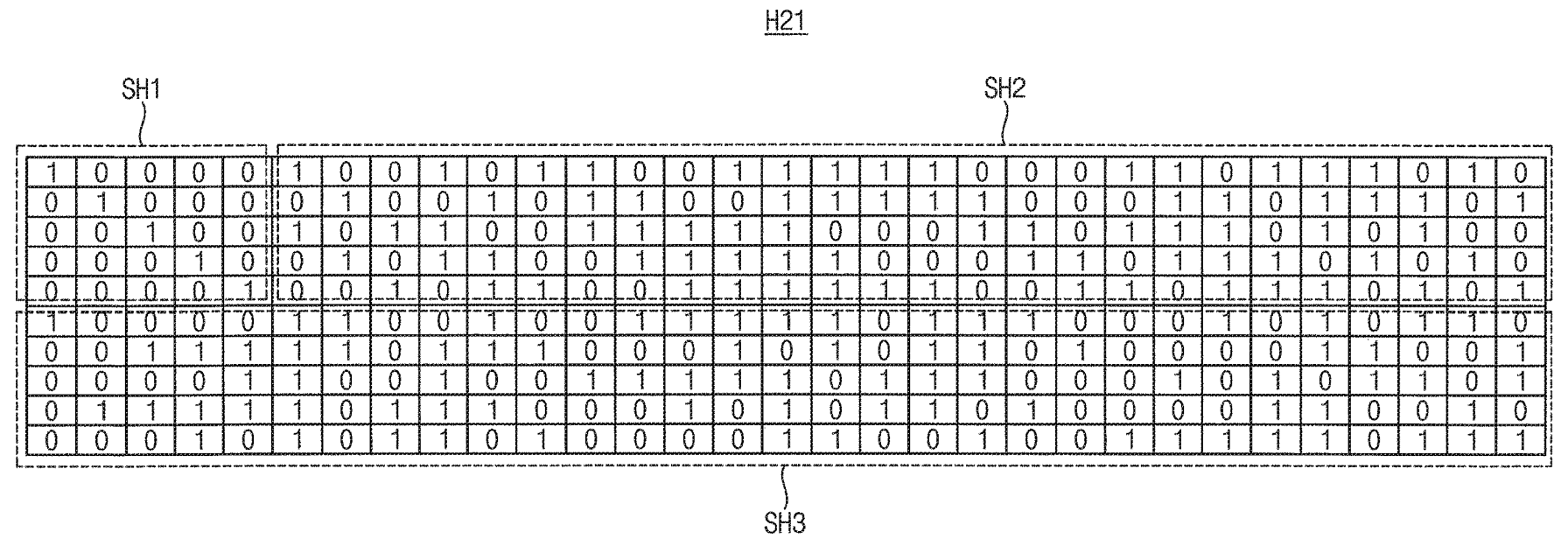

FIG. 12 illustrates an example of the first parity check matrix stored in the memory in the ECC engine of FIG. 8.

Referring to FIGS. 8 and 12, the first parity check matrix H21 may include a matrix having 10*31 elements. That is, the first parity check matrix H21 includes 10 row vectors and 31 column vectors.

The first parity check matrix H21 may include a first sub matrix SH1, a second sub matrix SH2 and a third sub matrix SH3. The first sub matrix SH1 includes 5*5 elements, the second sub matrix SH2 includes 5*26 elements and the first sub matrix SH3 includes 5*31 elements The first parity check matrix H21 may correct (t1+t2) error bits.

FIG. 13 illustrates an example of the second parity check matrix stored in the memory in the ECC engine of FIG. 8.

Referring to FIGS. 8 and 13, the second parity check matrix H22 may include a matrix having 5*31 elements. That is, the second parity check matrix H22 includes 5 row vectors and 31 column vectors.

The first parity check matrix H22 may correct t2 error bit.

Referring to FIGS. 10, 12 and 13, the second sub matrix SH2 is the same as the system parity check matrix H1 and the third sub matrix SH3 is the same as the second check matrix H22. Therefore, the first parity check matrix H21 may correct (t1+t2) error bits.

Figure 14:
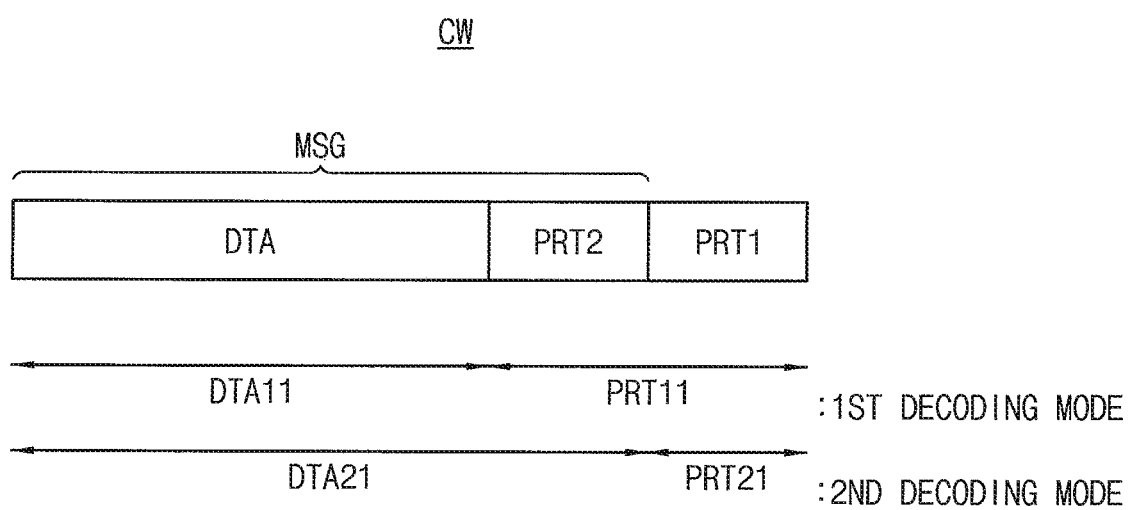
FIG. 14 illustrates an example configuration of the codeword that the ECC decoder outputs in the ECC engine of FIG. 8.

FIG. 14 illustrates an example configuration of the codeword that the ECC decoder outputs in the ECC engine of FIG. 8.

Referring to FIG. 14, the codeword CW includes the message MSG and the first parity bits PRT1, and the message MSG includes the data DTA and second parity bits PRT2.

If the decoding mode signal DMS designates the first decoding mode in FIG. 8, the ECC decoder 430 may correct (t1+t2) error bits in the codeword CW by using the first parity check matrix H21, using the data DTA as data bits DTA11 and using the first parity bits PRT1 and the second parity bits PRT2 as parity bits PRT11.

If the decoding mode signal DMS designates the second decoding mode in FIG. 8, the ECC decoder 430 may correct t2 error bit in the codeword CW by using the second parity check matrix H22, using the data DTA and the second parity bits PRT2 as data bits DTA21 and using the first parity bits PRT1 as parity bits PRT21.

Figure 15:
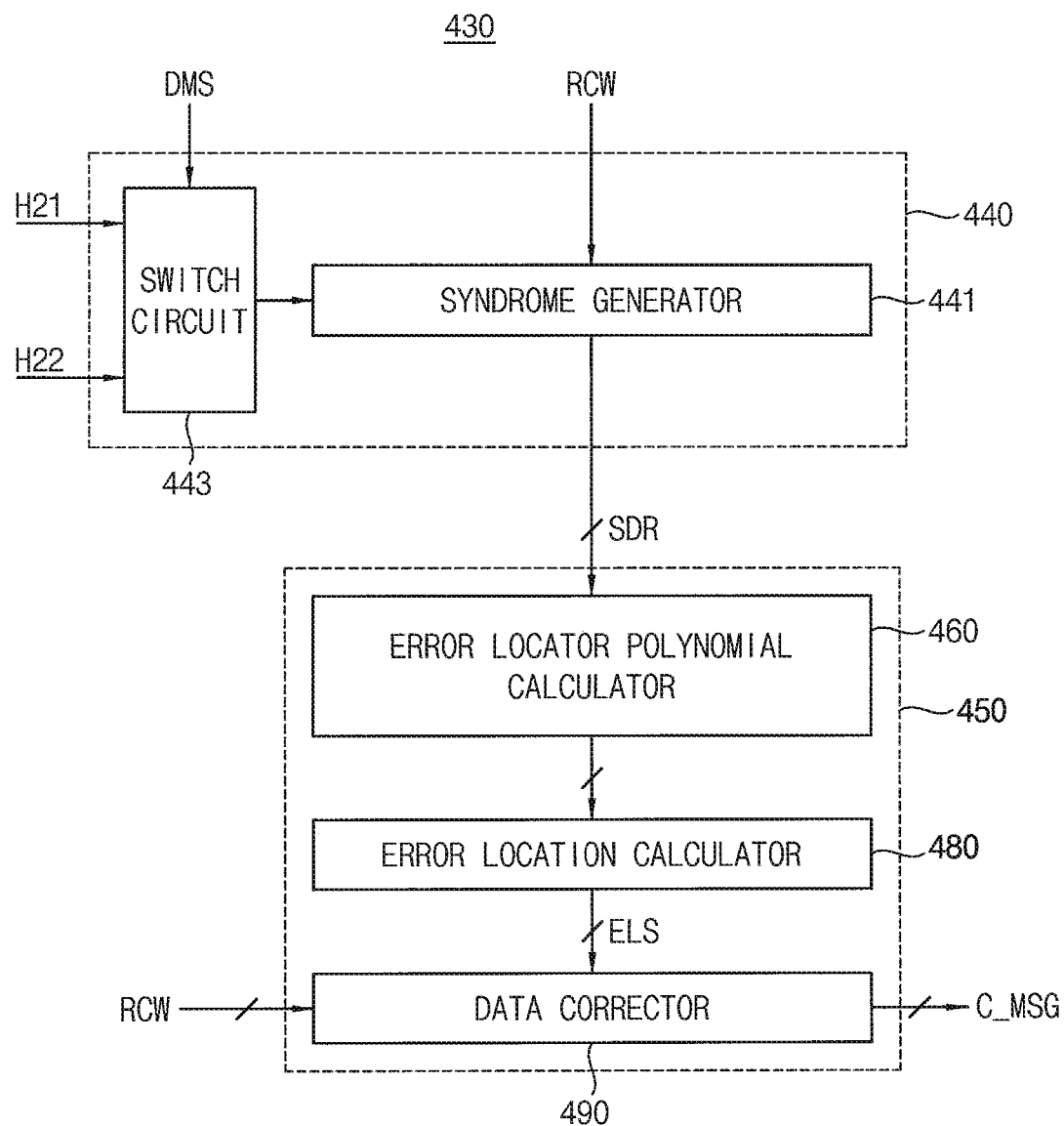
FIG. 15 is a block diagram illustrating an example of the ECC decoder in FIG. 8 according to some example embodiments.

FIG. 15 is a block diagram illustrating an example of the ECC decoder in FIG. 8 according to some example embodiments.

Referring to FIG. 15, the ECC decoder 430 may include a syndrome generation circuit 440 and a correction circuit 450.

The syndrome generation circuit 440 is connected to the memory 410 and may generate syndrome SDR based on message bits and the first parity bits in a read codeword (or, codeword) RCW read from the memory cell array 300 by using one of the first parity check matrix H21 and the second parity check matrix H22, in response to the decoding mode signal DMS. The correction circuit 450 receives the codeword RCW, corrects the at least a portion of (t1+t2) error bits in the codeword RCW based on the syndrome SDR and outputs a corrected message C_MSG.

The syndrome generation circuit 440 may include a switch circuit 443 and a syndrome generator 441.

The switch circuit 443 is connected to the memory 410 and receives the first parity check matrix H21 and the second parity check matrix H22. The switch circuit 443 selects one of the first parity check matrix H21 and the second parity check matrix H22 in response to the decoding mode signal DMS and provides the selected parity check matrix.

The syndrome generator 441 receives the read codeword RCW and the selected parity check matrix and generates the syndrome SDR based on the read codeword RCW by using the selected parity check matrix.

If the decoding mode signal DMS designates the first decoding mode, the switch circuit 443 selects the first parity check matrix H21 of the first parity check matrix H21 and the second parity check matrix H22. Therefore, the syndrome generator 441 generates the syndrome SDR based on the read codeword RCW and the first parity check matrix H21 in the first decoding mode.

If the decoding mode signal DMS designates the second decoding mode, the switch circuit 443 selects the second parity check matrix H22 of the first parity check matrix H21 and the second parity check matrix H22. Therefore, the syndrome generator 441 generates the syndrome SDR based on the read codeword RCW and the second parity check matrix H22 in the second decoding mode.

The correction circuit 450 may include an error locator polynomial calculator 460, an error location calculator 480, and/or a data corrector 490.

The error locator polynomial calculator 460 calculates coefficients of an error locator polynomial based on the syndrome SDR to provide the calculated coefficients to the error location calculator 480. The error location calculator 480 generates an error location signal ELS indicating a location of at least one error bit in the read codeword RCW, based on the error locator polynomial having the calculated coefficients.

The data corrector 490 receives the read codeword RCW and, if the read codeword RCW includes at least one error bit, corrects the at least one error bit in the read codeword RCW based on the error location signal ELS and outputs the corrected message C_MSG.

Figure 16:
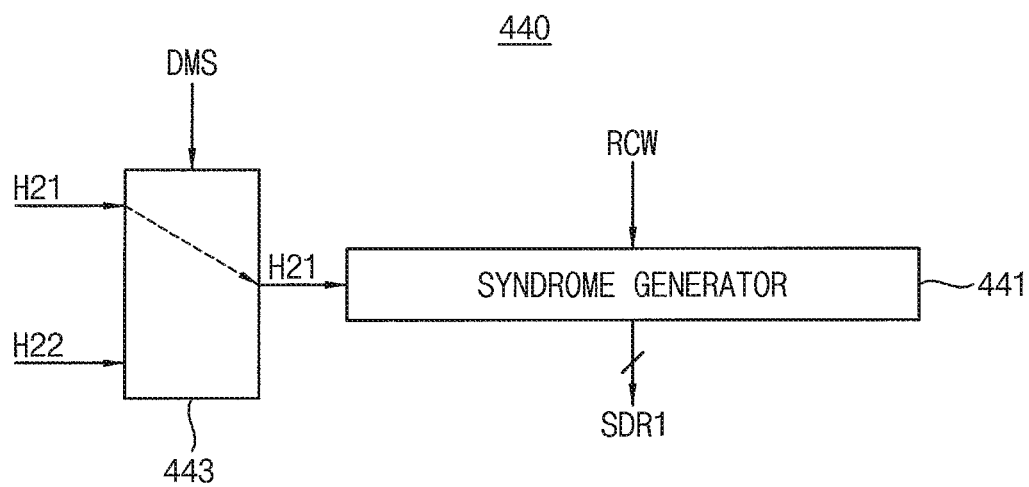
FIG. 16 illustrates the syndrome generation circuit in FIG. 15 in the first decoding mode.
Figure 17:
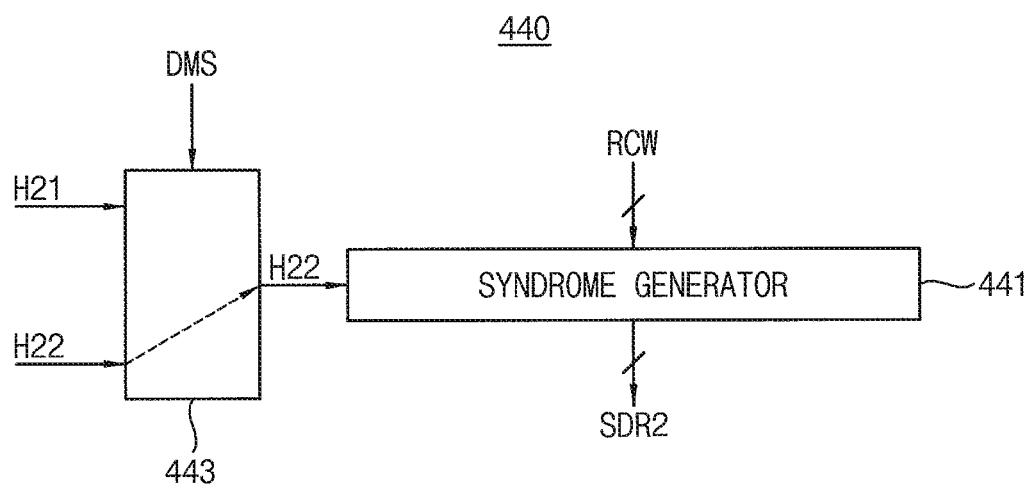
FIG. 17 illustrates the syndrome generation circuit in FIG. 15 in the second decoding mode.

FIG. 16 illustrates the syndrome generation circuit in FIG. 15 in the first decoding mode and FIG. 17 illustrates the syndrome generation circuit in FIG. 15 in the second decoding mode.

Referring to FIG. 16, if the decoding mode signal DMS designates the first decoding mode, the switch circuit 443 provides the first parity check matrix H21 to the syndrome generator 441. Therefore, the syndrome generator 441 generates a first syndrome SDR1 based on the read codeword RCW and the first parity check matrix H21 in the first decoding mode.

Referring to FIG. 17, if the decoding mode signal DMS designates the second decoding mode, the switch circuit 443 provides the second parity check matrix H22 to the syndrome generator 441. Therefore, the syndrome generator 441 generates a second syndrome SDR2 based on the read codeword RCW and the second parity check matrix H22 in the second decoding mode.

FIG. 18 is a table for explaining values in which both of the first decoding mode and the second decoding mode are possible according to correctable error bits in the first decoding mode and the second decoding mode.

In FIG. 18, it is assumed that the system ECC engine 130 of FIG. 3 uses (n1, k, 2*t1+1) code (a first code), n1=k+m+t1, and the ECC engine 400 of FIG. 8 uses (n2, n1, ≤2*t2+1) code (a second code).

Here, n2=k+m*t1+m*t2 and m is the smallest positive integer that satisfies 2m−1≥k+m*t1+m*t2.

Referring to FIG. 18, if m is equal to or greater than five and smaller than or equal to sixteen, the first decoding mode is possible for all values of m and the second decoding mode is possible for some of the values of m. The reason is that the second code the ECC engine 400 guarantees (n2, k, 2*t1+2*t2+1) and a minimum distance of code does not satisfy 2*t2+1 according to values of m, t1 and t2 in some cases. For example, m is eight, t1 is one and t2 is 1, the minimum distance of code does not guarantee 2*t2+1.

When the first generation polynomial $g1(x)=M_1(x) M_3(x) \ldots M_{2t1-1}(x)$ and the second generation polynomial $g2(x)=M_{2t1+1}(x) M_{2t1+3}(x) \ldots M_{2t2-1}$, the second generation polynomial g2(x) does not include a primitive polynomial in some cases.

The second generation polynomial g2(x) includes the primitive polynomial on condition that GCD(2t1+1, $2^m$−1) *GCD(2t1+3, $2^m$−1)* . . . *GCD(2t2−1, $2^m$−1)=1. Here, GCD represents 'the greatest common denominator'. In the table of FIG. 18, if t1 is one and t2 is one, m satisfying above condition is 5, 7, 9, 11, 13 or 15.

Figure 19:
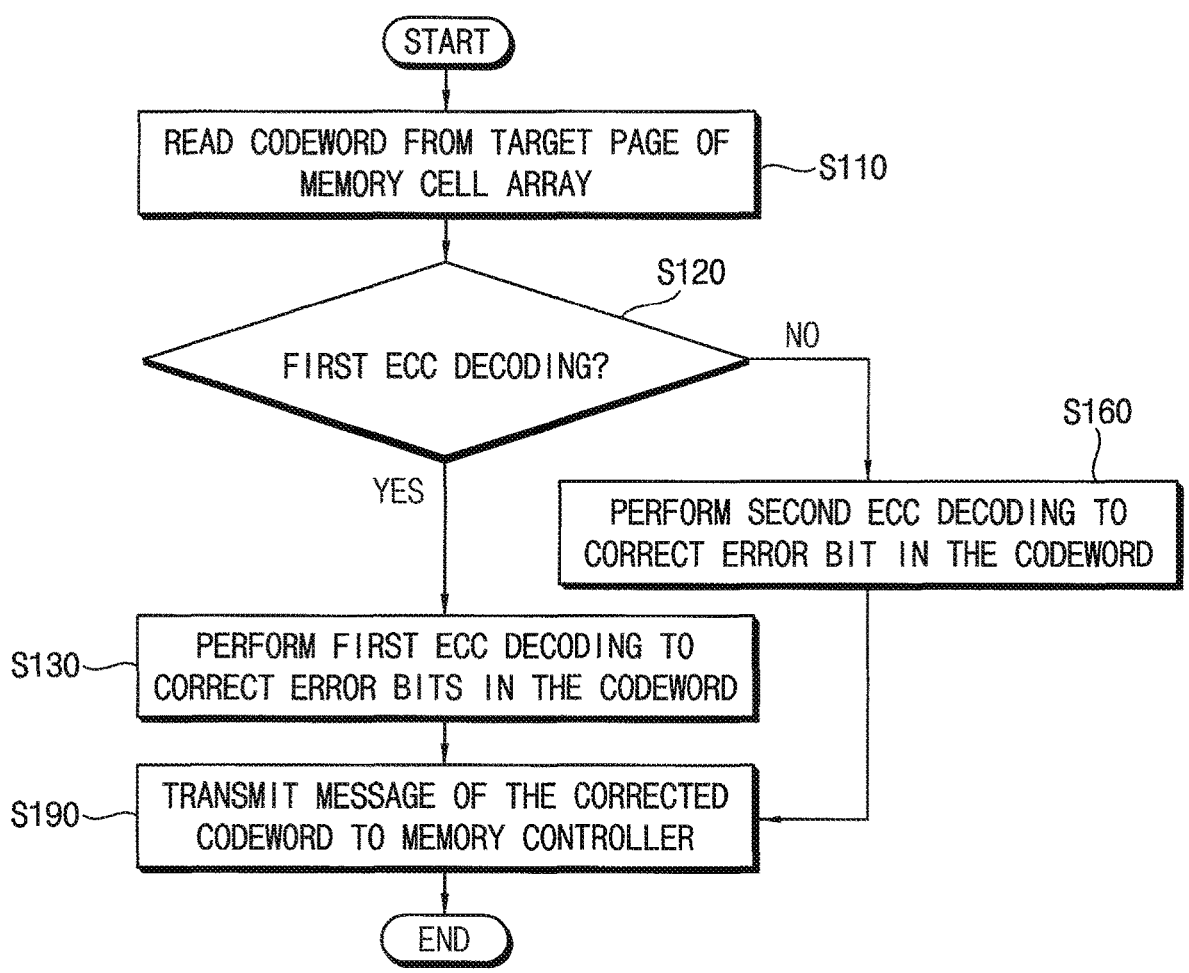
FIG. 19 is a flow chart illustrating a method of operating a semiconductor memory device according to some example embodiments.

FIG. 19 is a flow chart illustrating a method of operating a semiconductor memory device according to some example embodiments.

Referring to FIGS. 5 through 19, in a method of operating the semiconductor memory device 200, the ECC decoder 430 reads the codeword CW from the target page of the memory cell array 300 in operation S110. The control logic circuit 210 determines whether to perform a first ECC decoding on the codeword CW in operation S120. If the control logic circuit 210 determines to perform the first ECC decoding on the codeword CW (YES in operation S120), the control logic circuit 210 controls the ECC decoder 430 to perform the first ECC decoding on the codeword CW to correct at least one error bit in the codeword in operation S130).

If the control logic circuit 210 determines not to perform the first ECC decoding on the codeword CW (NO in operation S120), the control logic circuit 210 controls the ECC decoder 430 to perform a second ECC decoding on the codeword CW to correct at least one error bit in the codeword in operation S160).

The semiconductor memory device 200 transmits a message of the corrected codeword to the memory controller 100 in operation S190.

Figure 20:
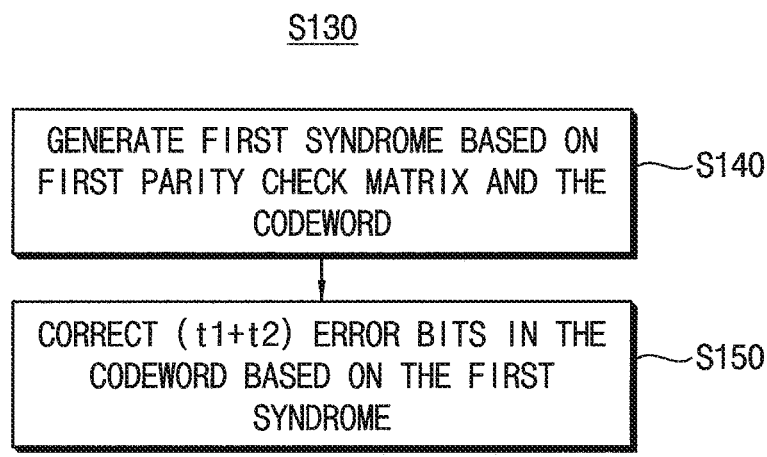
FIG. 20 is a flow chart illustrating the first decoding operation in FIG. 19.

FIG. 20 is a flow chart illustrating the first decoding operation in FIG. 19.

Referring to FIGS. 5 through 18 and 20, for performing the first ECC decoding on the codeword in operation S130, the syndrome generation circuit 440 in the ECC decoder 430 generates the first syndrome SDR1 based on the first parity check matrix H21 and the codeword CW in operation S140. The correction circuit 450 in the ECC decoder 430 corrects (t1+t2) error bits in the codeword CW based on the first syndrome SDR1 in operation S150.

Figure 21:
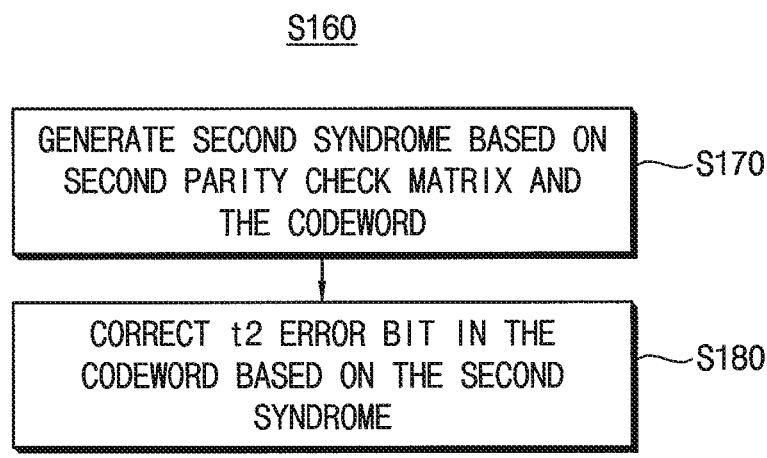
FIG. 21 is a flow chart illustrating the second ECC decoding operation in FIG. 19.

FIG. 21 is a flow chart illustrating the second ECC decoding operation in FIG. 19.

Referring to FIGS. 5 through 18 and 21, for performing the second ECC decoding on the codeword in operation S160, the syndrome generation circuit 440 in the ECC decoder 430 generates the second syndrome SDR2 based on the second parity check matrix H22 and the codeword CW in operation S170. The correction circuit 450 in the ECC decoder 430 corrects t2 error bit in the codeword CW based on the second syndrome SDR2 in operation S150.

Figure 22:
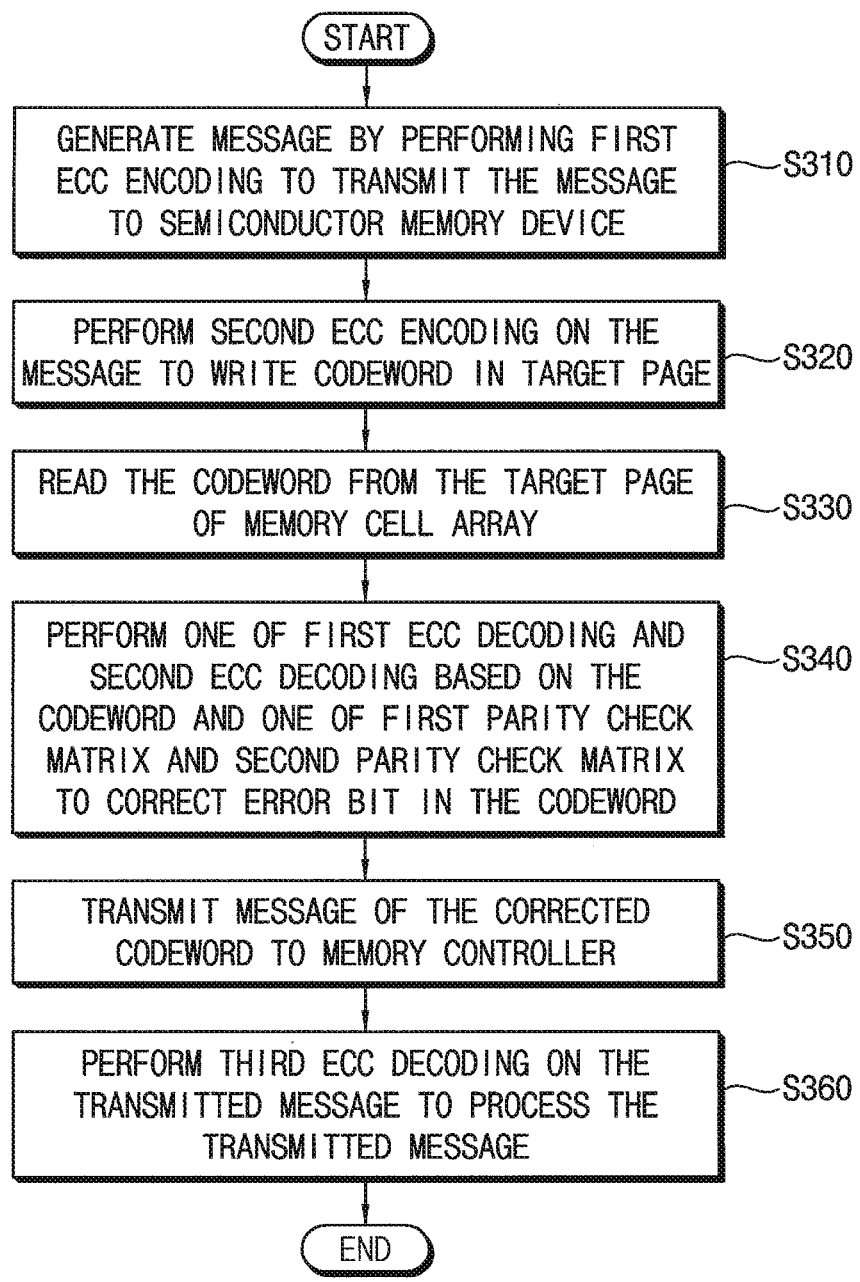
FIG. 22 is a flow chart illustrating a method of operating a memory system according to some example embodiments.

FIG. 22 is a flow chart illustrating a method of operating a memory system according to some example embodiments.

Referring to FIGS. 1 through 22, in a method of operating a memory system 10 including a semiconductor memory device 200 and a memory controller 100 to control the semiconductor memory device 200, the memory controller 100 performs a first ECC encoding on data DTA to generate message MSG and transmits the message MSG to the semiconductor memory device 200 in operation S310.

The ECC encoder 420 in the semiconductor memory device 200 performs a second ECC encoding on the message MSG to generate codeword CW and writes the codeword CW in a target page of the memory cell array 300 in operation S320.

The ECC decoder 430 in the semiconductor memory device 200 reads the codeword CW from the target page of the memory cell array in operation S330. The ECC decoder 430 performs one of the first ECC decoding and the second ECC decoding on the codeword CW based on the message MSG and the first parity bits PRT1, in response to the decoding mode signal DMS to correct at least one error bit in the codeword CW in operation S340.

The semiconductor memory device 200 transmits a corrected message C_MSG to the memory controller 100 in operation S350. An ECC decoder 150 in the memory controller 100 performs a third ECC decoding on the corrected message C_MSG to process the corrected message C_MSG in operation S360.

According to some example embodiments, the semiconductor memory device 200 obtains code information of a system ECC engine having t1-bit error correction capability, the semiconductor memory device 200 having t2-bit error correction capability may correct (t1+t2) error bits by selectively using a parity check matrix associated with the code information of the system ECC engine when the semiconductor memory device 200 performs ECC decoding. Therefore, the semiconductor memory device 200 may enhance error correction capability of the on-chip ECC engine and may use the on-chip ECC engine efficiently.

Figure 23:
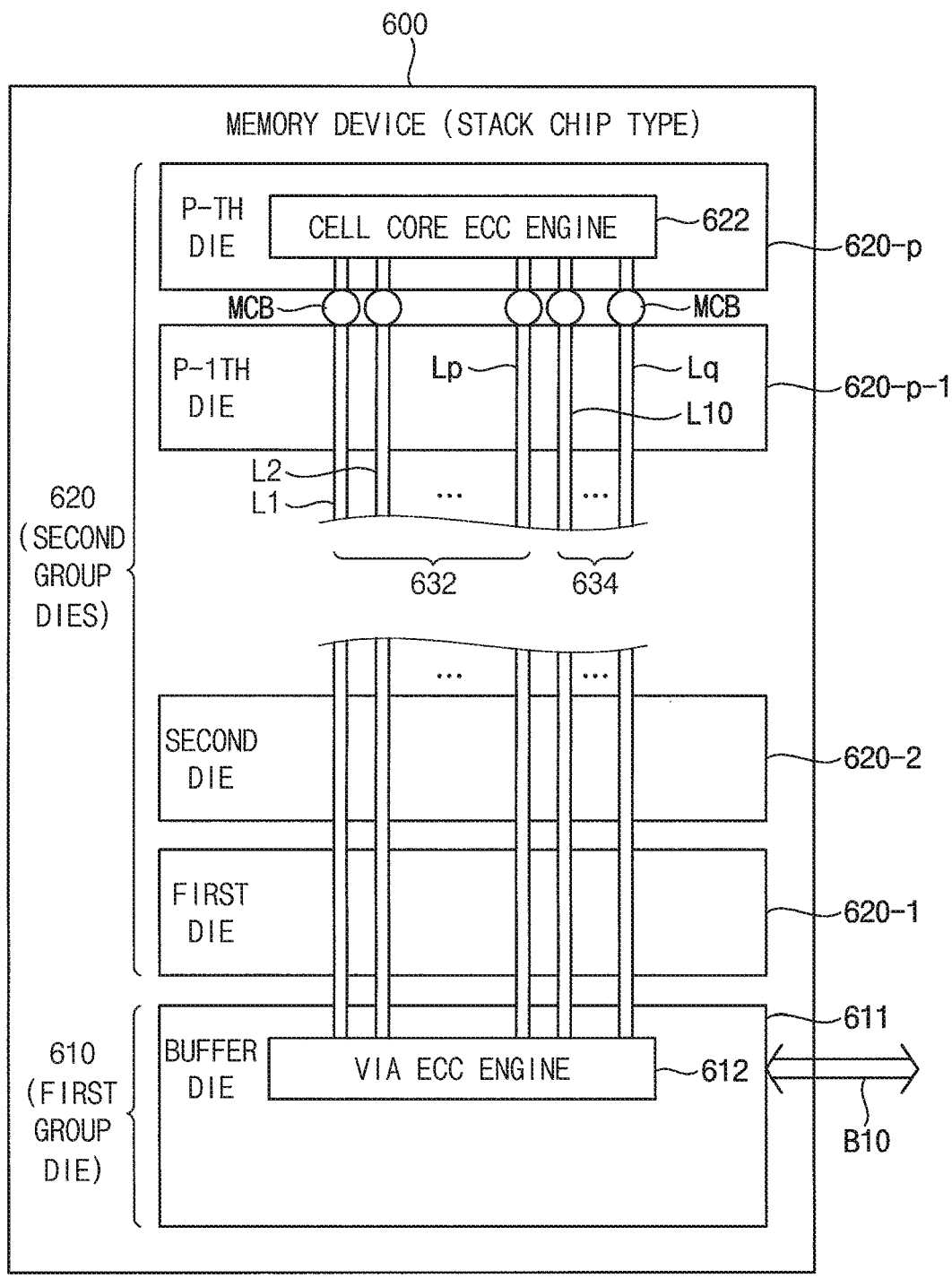
FIG. 23 is a block diagram illustrating a semiconductor memory device according to some example embodiments.

FIG. 23 is a block diagram illustrating a semiconductor memory device according to some example embodiments.

Referring to FIG. 23, a semiconductor memory device 600 may include first group die 610 and second group dies 620 providing a soft error analyzing and correcting function in a stacked chip structure.

The first group die 610 may include at least one buffer die 611. The second group dies 620 may include a plurality of memory dies 620-1 to 620-$p$ which are stacked on the at least one buffer die 611 and convey data through a plurality of through silicon via (TSV) lines. Here, $p$ is a natural number greater than two.

Each of the memory dies 620-1 to 620-$p$ includes a memory cell array that stores data, and at least one of the memory dies 620-1 to 620-$p$ may include a first type ECC engine 622 which generates transmission parity bits (e.g., transmission parity data) based on transmission data to be sent to the first group die 610. The first type ECC engine 622 may be referred to as 'cell core ECC engine'. The first type ECC engine 622 may employ the ECC engine 400 of FIG. 8. Therefore, the first type ECC engine 622 may perform a first ECC decoding to correct (t1+t2) error bits or may perform a second ECC decoding to correct t2 error bit in the ECC decoding operation.

The at least one buffer die 611 may include a second type ECC engine 612 which corrects a transmission error using the transmission parity bits when a transmission error is detected from the transmission data received through the TSV lines and generates error-corrected data. The second type ECC engine 612 may be referred to as 'via ECC engine'.

With the above description, a data TSV line group 632 which is formed at one memory die 620-$p$ may include TSV lines L1 to Lp, and a parity TSV line group 634 may include TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-$p$.

At least one of the memory dies 620-1 to 620-$p$ may include DRAM cells each including at least one access transistor and one storage capacitor.

The semiconductor memory device 600 may have a three-dimensional (3D) chip structure or a 2.5D chip structure to communicate with the host through a data bus B10. The buffer die 611 may be connected with a memory controller through the data bus B10.

When an error is detected from read data in a high bandwidth memory (HBM) or the stacked memory structure, it is determined whether the error is an error occurring due to noise while data is transmitted through the TSV or the error is an error occurring in the memory die.

According to some example embodiments, as illustrated in FIG. 23, the cell core ECC engine 622 may be included in the memory die, the via ECC engine 612 may be included in the buffer die 611. Accordingly, it may be possible to detect and correct soft data fail. The soft data fail may include a transmission error which is generated due to noise when data is transmitted through TSV lines.

Figure 24:
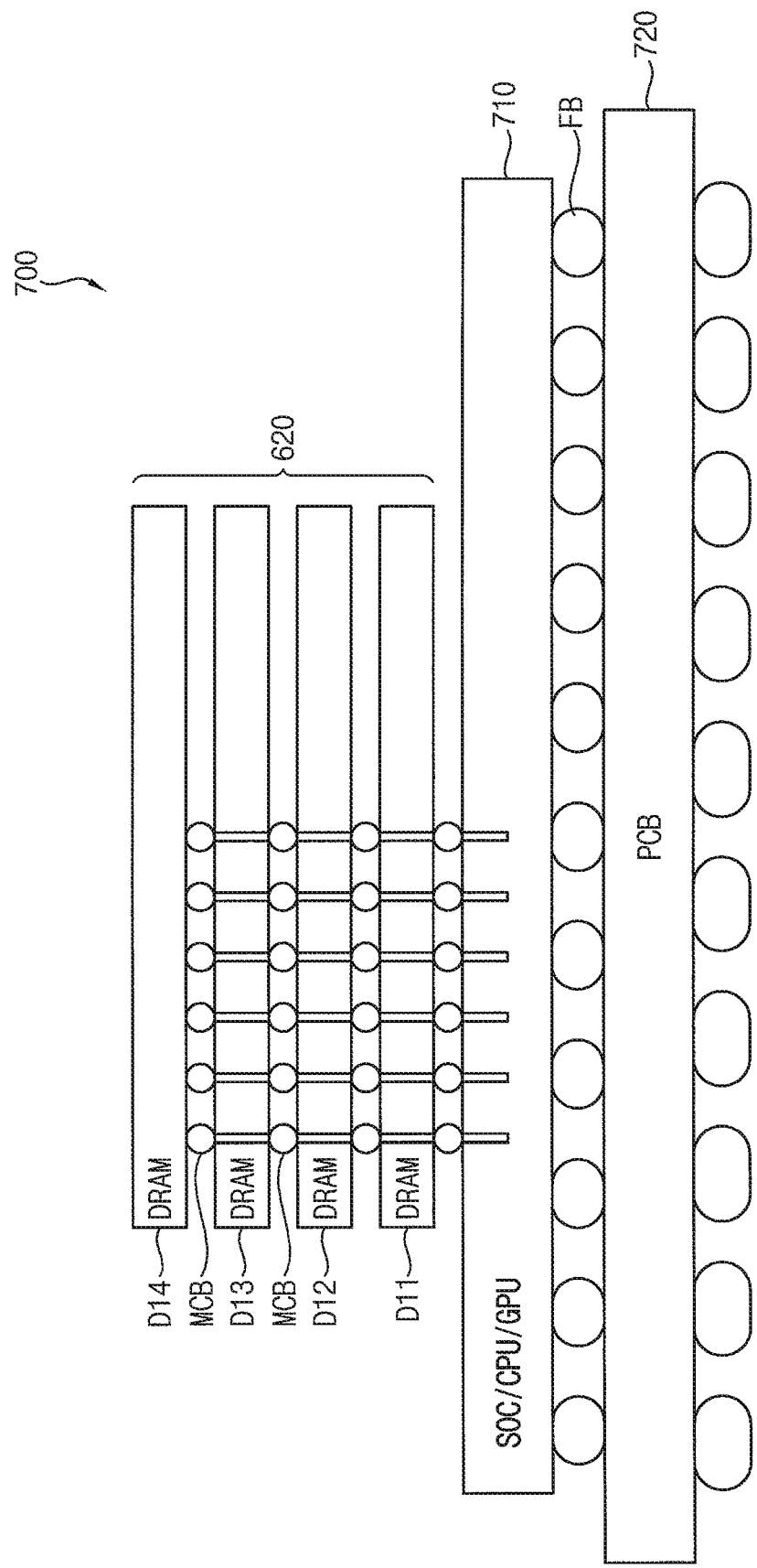
FIG. 24 is a cross-sectional view of a 3D chip structure employing the semiconductor memory device of FIG. 23 according to some example embodiments.

FIG. 24 is a cross-sectional view of a 3D chip structure employing the semiconductor memory device of FIG. 23 according to some example embodiments.

FIG. 24 shows a 3D chip structure 700 in which a host and a HBM are directly connected without an interposer layer.

Referring to FIG. 24, a host die 710 such as a system-on-chip (SoC), a central processing unit (CPU), and/or a graphic processing unit (GPU) may be disposed on a printed circuit board (PCB) 720 using flip chip bumps FB. Memory dies D11 to D14 may be stacked on the host die 710 to implement a HBM structure such as the memory dies 620 in FIG. 23. In FIG. 24, the buffer die 611 or a logic die of FIG. 23 is omitted. However, the buffer die 611 or the logic die may be disposed between the memory die D11 and the host die 710. To implement the HBM structure such as the memory dies 620, TSV lines may be formed at the memory dies D11 and D14. The TSV lines may be electrically connected with micro bumps MCB placed between memory dies.

Figure 25:
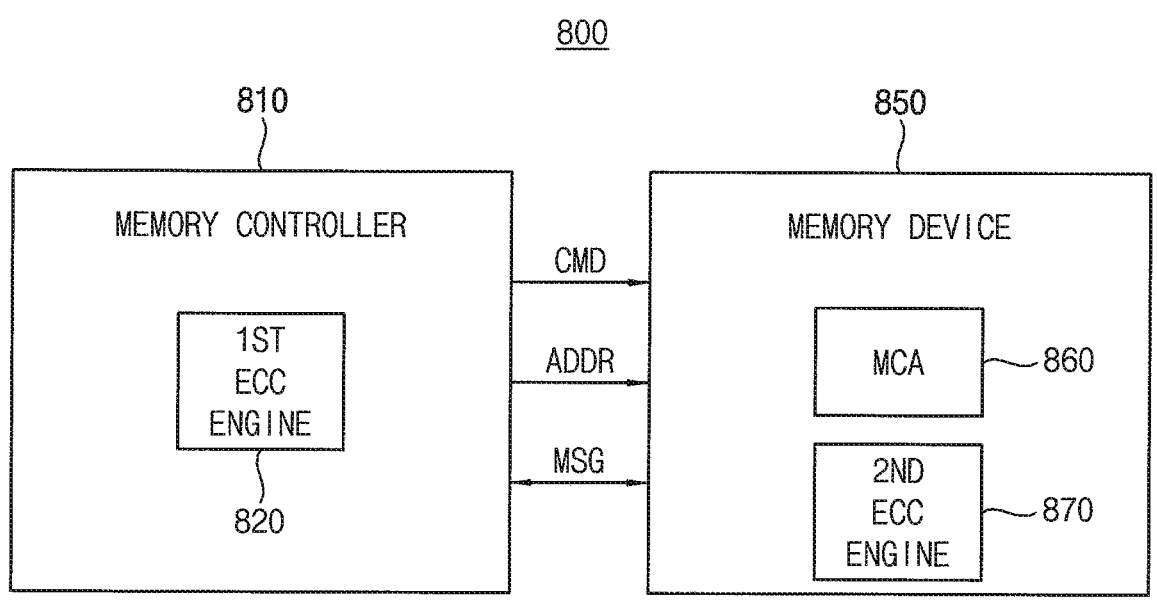
FIG. 25 is a block diagram illustrating a memory system according to some example embodiments.

FIG. 25 is a block diagram illustrating a memory system according to some example embodiments.

Referring to FIG. 25, a memory system 800 may include a memory controller 810 and a semiconductor memory device 850.

The memory controller 810 includes a first ECC engine 820. The first ECC engine 820 may perform a first ECC encoding in data to be transmitted to the semiconductor memory device 850 by using a first generation polynomial to generate a message MSG including the data and second parity bits and transmits the message MSG to the semiconductor memory device 850. The first ECC engine 820 may correct t1 error bits in the message MSG.

In addition, the memory controller 810 transmits a command CMD and an address ADDR to the semiconductor memory device 850. The first ECC engine 820 may employ the system ECC engine 130 in FIG. 3.

The semiconductor memory device 850 includes a memory cell array 860 and a second ECC engine (circuit) 870.

The second ECC engine 870 performs an ECC encoding on the message MSG to generate a codeword including the message MSG and first parity bits and store the codeword in the memory cell array 860. The memory cell array 860 may include a plurality of dynamic memory cells or a plurality of resistive type memory cells.

In a read operation of the semiconductor memory device 850, the second ECC engine 870 performs a first ECC decoding on the codeword read from the memory cell array 860 to correct (t1+t2) error bits in the codeword or performs a second ECC decoding on the codeword read from the memory cell array 860 to correct t2 error bit in the codeword. The second ECC engine 870 may employ the ECC engine 400 of FIG. 8. Therefore, the second ECC engine 870 may perform the first ECC decoding by using a first parity check matrix or may perform the second ECC decoding by using a second parity check matrix. The first parity check matrix may include a system parity check matrix which an ECC decoder in the first ECC engine 820 uses as a part of the first parity check matrix.

The semiconductor memory device 850 may be a volatile or nonvolatile memory device that employ on-chip ECC engine.

Figure 26:
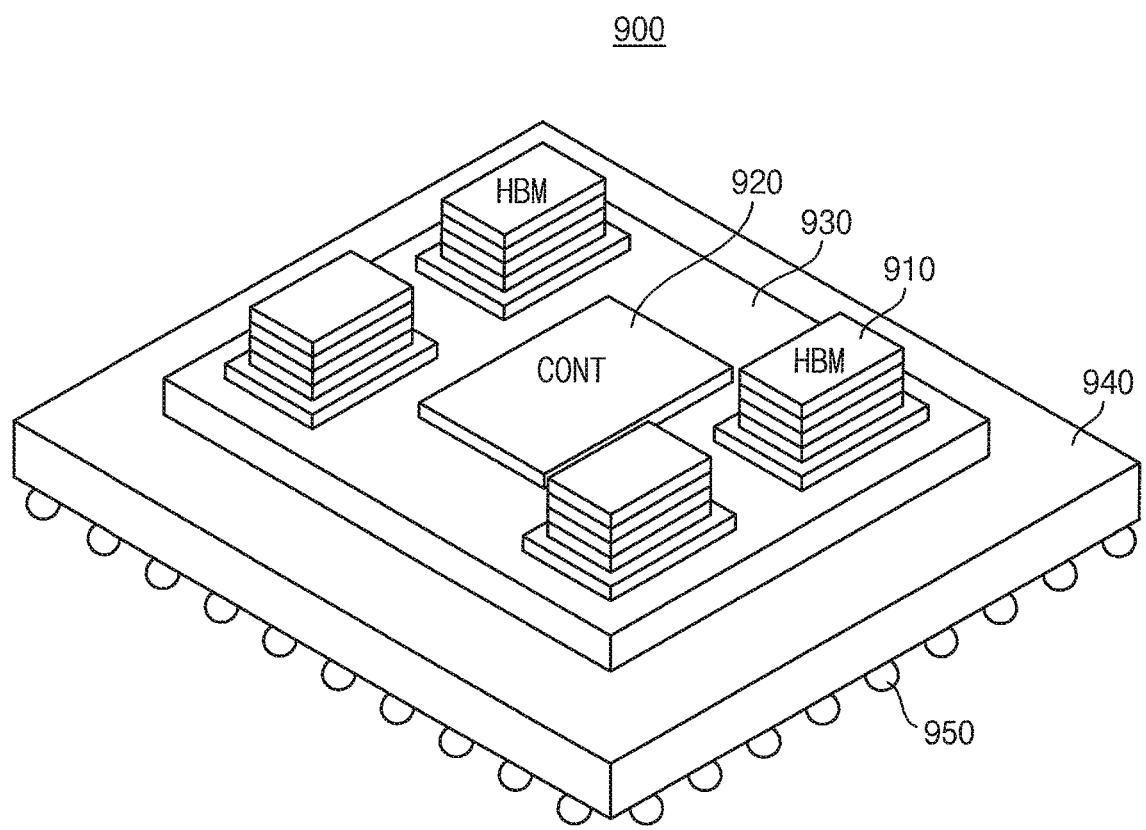
FIG. 26 is a configuration diagram illustrating a semiconductor package including the memory device according to some example embodiments.

FIG. 26 is a configuration diagram illustrating a semiconductor package including the memory device according to some example embodiments.

Referring to FIG. 26, a semiconductor package 900 may include one or more (stacked) memory devices 910 and a memory controller 920.

The stacked memory devices 910 and memory controller 920 may be mounted on an interposer 930, and the interposer on which the stacked memory device 910 and memory controller 920 are mounted may be mounted on a package substrate 940. The memory controller 920 may correspond to a semiconductor device which may perform a memory control function, and for example, memory controller 920 may be implemented as an application processor (AP).

The stacked memory device 910 may be implemented in various forms, and the stacked memory device 910 may be a memory device in a high bandwidth memory (HBM) form in which a plurality of layers are stacked Therefore, the stacked memory device 910 may include at least one buffer die and a plurality of memory dies and at least one of the memory dies may include a memory cell array and an ECC engine.

The ECC engine, when performing an ECC decoding in a read operation, performs a first ECC decoding on the codeword read from the memory cell array to correct (t1+t2) error bits in the codeword or performs a second ECC decoding on the codeword read from the memory cell array to correct t2 error bit in the codeword. The ECC engine may employ the ECC engine 400 of FIG. 8. Therefore, the ECC engine may perform the first ECC decoding by using a first parity check matrix or may perform the second ECC decoding by using a second parity check matrix.

The plurality of stacked memory devices 910 may be mounted on the interposer 930, and memory controller 920 may communicate with the plurality of stacked memory devices 910. Here, the interposer 930 may include a TSV form, an embedded multi-die interconnect bridge (EMIB) which is non-TSV manner and/or a printed circuit board (PCB) form.

According to some example embodiments, the semiconductor memory device 200 obtains code information of a system ECC engine having t1-bit error correction capability, the semiconductor memory device 200 having t2-bit error correction capability may correct (t1+t2) error bits by selectively using a parity check matrix associated with the code information of the system ECC engine when the semiconductor memory device 200 performs ECC decoding. Therefore, the semiconductor memory device 200 may enhance error correction capability of on-chip ECC engine and may use on-chip ECC engine efficiently.

The present disclosure may be applied to semiconductor memory devices and memory systems employing the ECC. That is, the present disclosure may be applied to various memory systems, storage devices and/or computers.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. An error correction code (ECC) circuit of a semiconductor memory device, the ECC circuit comprising:
a syndrome generation circuit configured to generate a syndrome based on a message and first parity bits in a codeword read from a memory cell array by using one of a first parity check matrix and a second parity check matrix, in response to a decoding mode signal, the message including system check bits;
an ECC encoder configured to generate the first parity bits based on the message; and
a correction circuit configured to
receive the codeword,
correct at least a portion of (t1+t2) error bits in the codeword, based on the syndrome, wherein t1 and t2 are natural numbers, and
output a corrected message.

2. The ECC circuit of claim 1, wherein the syndrome generation circuit includes
a switch circuit configured to
receive the first parity check matrix and the second parity check matrix, and
select one of the first parity check matrix and the second parity check matrix in response to the decoding mode signal, and
a syndrome generator, connected to the switch circuit, configured to generate the syndrome based on the codeword by using the selected parity check matrix.

3. The ECC circuit of claim 2, wherein
the switch circuit is further configured to select the first parity check matrix if the decoding mode signal designates a first decoding mode, and
the syndrome generator is further configured to generate the syndrome based on the codeword by using the first parity check matrix, if the decoding mode signal designates the first decoding mode.

4. The ECC circuit of claim 3, wherein
the correction circuit is further configured to correct (t1+t2) error bits in the codeword based on the syndrome.

5. The ECC circuit of claim 2, wherein
the switch circuit is further configured to select the second parity check matrix if the decoding mode signal designates a second decoding mode; and
the syndrome generator is further configured to generate the syndrome based on the codeword by using the second parity check matrix, if the decoding mode signal designates the second decoding mode.

6. The ECC circuit of claim 5, wherein
the correction circuit is configured to correct t2 error bits in the codeword based on the syndrome.

7. The ECC circuit of claim 1, wherein the correction circuit includes:
an error locator polynomial calculator configured to calculate coefficients of an error locator polynomial based on the syndrome;
an error location calculator configured to generate an error location signal indicating a location of at least one error bit in the codeword, based on the error locator polynomial having the calculated coefficients; and
a data corrector configured to
correct the at least one error bit in the codeword based on the error location signal, and
output the corrected message.

8. The ECC circuit of claim 1, further comprising:
a mode selector configured to generate the decoding mode signal.

9. The ECC circuit of claim 1, further comprising:
a memory configured to store the first parity check matrix and the second parity check matrix, wherein
the first parity check matrix includes the second parity check matrix and a system parity check matrix, and
a memory controller is configured to
generate the system parity check matrix,
transmit the message to the semiconductor memory device, and
use the system parity check matrix in ECC decoding.

10. A semiconductor memory device, comprising:
a memory cell array including a plurality of memory cells coupled to a plurality of word-lines and a plurality of bit-lines;
an error correction code (ECC) circuit configured to
generate a codeword by performing ECC encoding on a message received from a memory controller, the message including system parity bits encoded by the memory controller based on a first generation matrix, and the codeword being generated based on a second generation matrix, generate a syndrome based on the message and first parity bits in a read codeword from the memory cell array, correct at least a portion of (t1+t2) error bits in the read codeword based on the syndrome, wherein t1 and t2 are natural numbers, and output a corrected message; and a control logic circuit configured to control the ECC circuit based on a command and an address received from the memory controller.

11. The semiconductor memory device of claim 10, wherein the error correction code circuit is configured to correct fewer than or equal to t2 error bits, and the memory controller is configured to transmit the message to the semiconductor memory device, and correct fewer than or equal to t1 error bits.

12. The semiconductor memory device of claim 10, wherein the ECC circuit includes:

an ECC encoder configured to perform the ECC encoding on the message; and an ECC decoder, including:

a syndrome generation circuit configured to generate the syndrome based on the message and the first parity bits by using one of a first parity check matrix and a second parity check matrix, in response to a decoding mode signal; and a correction circuit configured to correct at least the portion of (t1+t2) error bits in the codeword based on the syndrome and configured to output the corrected message.

13. The semiconductor memory device of claim 12, wherein the syndrome generation circuit includes:

a switch circuit configured to receive the first parity check matrix and the second parity check matrix, and select one of the first parity check matrix and the second parity check matrix in response to the decoding mode signal, and a syndrome generator, connected to the switch circuit, configured to generate the syndrome based on the codeword by using the selected parity check matrix.

14. The semiconductor memory device of claim 13, wherein the switch circuit is further configured to select the first parity check matrix if the decoding mode signal designates a first decoding mode, the syndrome generator is further configured to generate the syndrome based on the codeword by using the first parity check matrix if the decoding mode signal designates the first decoding mode, and the correction circuit is further configured to correct (t1+t2) error bits in the codeword based on the syndrome.

15. The semiconductor memory device of claim 13, wherein the switch circuit is further configured to select the second parity check matrix if the decoding mode signal designates a second decoding mode, the syndrome generator is further configured to generate the syndrome based on the codeword by using the second parity check matrix, if the decoding mode signal designates the second decoding mode, and the correction circuit is further configured to correct t2 error bits in the codeword based on the syndrome.

16. The semiconductor memory device of claim 12, wherein the ECC circuit further includes:

a mode selector configured to generate the decoding mode signal based on a control signal; and a memory configured to store the second generation matrix, the first parity check matrix and the second parity check matrix, wherein the first parity check matrix includes the second parity check matrix and a system parity check matrix, and the memory controller is configured to use the system parity check matrix in ECC decoding.

17. The semiconductor memory device of claim 12, wherein each of the plurality of memory cells includes a dynamic memory cell, the first parity check matrix represents a double error correction (DEC) code, and the second parity check matrix represents a single error correction (SEC) code.

18. The semiconductor memory device of claim 10, further comprising:

at least one buffer die; and a plurality of memory dies stacked on the at least one buffer die and conveying data through a plurality of through silicon via (TSV) lines, wherein at least one of the plurality of memory dies includes the memory cell array and the ECC circuit, the ECC circuit generates transmission parity bits using transmission data to be sent to the at least one buffer die, and the at least one buffer die includes a via ECC engine configured to correct a transmission error using the transmission parity bits in response to the transmission error being detected from the transmission data received through the plurality of TSV lines.

19. A memory system comprising:

a semiconductor memory device; and a memory controller configured to control the semiconductor memory device, the memory controller including, a system error correction code (ECC) engine including a system ECC encoder configured to perform system ECC encoding on data bits using a first generation matrix to generate a message, wherein the semiconductor memory device includes, a memory cell array including a plurality of memory cells coupled to a plurality of word-lines and a plurality of bit-lines, an ECC circuit configured to, generate a codeword by performing ECC encoding on the message received from the memory controller based on a second generation matrix, generate a syndrome based on the message and first parity bits in a read codeword from the memory cell array, correct at least a portion of (t1+t2) error bits in the read codeword based on the syndrome, wherein t1 and t2 are natural numbers, and output a corrected message, and a control logic circuit configured to control the ECC circuit based on a command and an address received from the memory controller.

20. The memory system of claim 19, wherein the ECC circuit includes:
an ECC encoder configured to perform the ECC encoding on the message, and
an ECC decoder including,
a syndrome generation circuit configured to generate the syndrome based on the message and the first parity bits by using one of a first parity check matrix and a second parity check matrix, in response to a decoding mode signal, and
a correction circuit configured to,
correct at least the portion of (t1+t2) error bits in the codeword based on the syndrome, and
output the corrected message,
wherein the system ECC engine is configured to correct fewer than or equal to t1 error bits, and
the ECC circuit is configured to correct fewer than or equal to (t1+t2) error bits.

\* \* \* \* \*